US012707955B2

(12) United States Patent
Li et al.

(10) Patent No.: US 12,707,955 B2
(45) Date of Patent: Aug. 11, 2026

(54) THROUGH-SUBSTRATE-VIA CELL

(71) Applicant: Taiwan Semiconductor Manufacturing Company, Ltd., Hsinchu (TW)

(72) Inventors: Yun-Sheng Li, Hsinchu (TW); Chih Hsin Yang, Hsinchu County (TW); Chih-Chieh Chang, Hsinchu (TW); Mao-Nan Wang, Kaohsiung (TW); Kuan-Hsun Wang, Hsinchu City (TW); Yang-Hsin Shih, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 358 days.

(21) Appl. No.: 18/417,993

(22) Filed: Jan. 19, 2024

(65) Prior Publication Data

US 2025/0118655 A1 Apr. 10, 2025

Related U.S. Application Data

(60) Provisional application No. 63/589,071, filed on Oct. 10, 2023.

(51) Int. Cl.

| | |
|---|---|
| ***H10W 20/20*** | (2026.01) |
| ***H10D 30/01*** | (2025.01) |
| ***H10D 30/62*** | (2025.01) |
| ***H10D 62/10*** | (2025.01) |

(Continued)

(52) U.S. Cl.

CPC .......... *H10W 20/20* (2026.01); *H10D 30/024* (2025.01); *H10D 30/62* (2025.01); *H10D 30/6219* (2025.01); *H10D 62/106* (2025.01); *H10D 89/601* (2025.01); *H10W 20/43* (2026.01)

(58) Field of Classification Search

CPC ............ H10W 20/20–233; H10D 62/106–107

See application file for complete search history.

(56) References Cited

U.S. PATENT DOCUMENTS

| | | | |
|---|---|---|---|
| 2023/0163084 | A1 | 5/2023 | Ku |
| 2023/0301101 | A1 | 9/2023 | Lee |
| 2023/0307386 | A1 | 9/2023 | Zhong |

FOREIGN PATENT DOCUMENTS

| | | |
|---|---|---|
| TW | 202339110 A | 10/2023 |
| TW | 202339266 A | 10/2023 |

*Primary Examiner* — Amar Movva

(74) *Attorney, Agent, or Firm* — HAYNES AND BOONE, LLP

(57) ABSTRACT

A semiconductor structure according to the present disclosure includes a substrate; a through substrate via (TSV) cell over the substrate; and a TSV extending through the TSV cell and the substrate. The TSV cell includes a guard ring structure extending around a perimeter of the TSV cell, and a buffer zone surrounded by the guard ring. The buffer zone includes first dummy transistors, and second dummy transistors. Each of the first dummy transistors includes two first type epitaxial features, a first plurality of nanostructures extending between the two first type epitaxial features, and a first isolation gate structure wrapping over the first plurality of nanostructures. Each of the second dummy transistors includes two second type epitaxial feature, a second plurality of nanostructures extending between the two first type epitaxial features, and a second isolation gate structure wrapping over the second plurality of nanostructures.

20 Claims, 24 Drawing Sheets

(51) Int. Cl.

| | |
|---|---|
| ***H10D 89/60*** | (2025.01) |
| ***H10W 20/43*** | (2026.01) |

THROUGH-SUBSTRATE-VIA CELL

PRIORITY DATA

This application claims the benefit of U.S. Provisional Application No. 63/589,071, filed Oct. 10, 2023, the entirety of which is hereby incorporated by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Through-silicon or through-substrate vias (TSVs) have been adopted in three-dimensional (3D) ICs for routing electrical signal from one side of a substrate of an IC to the other side thereof. Generally, a TSV is formed by etching a vertical via opening through a substrate and filling the via opening with a conductive material, such as copper.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
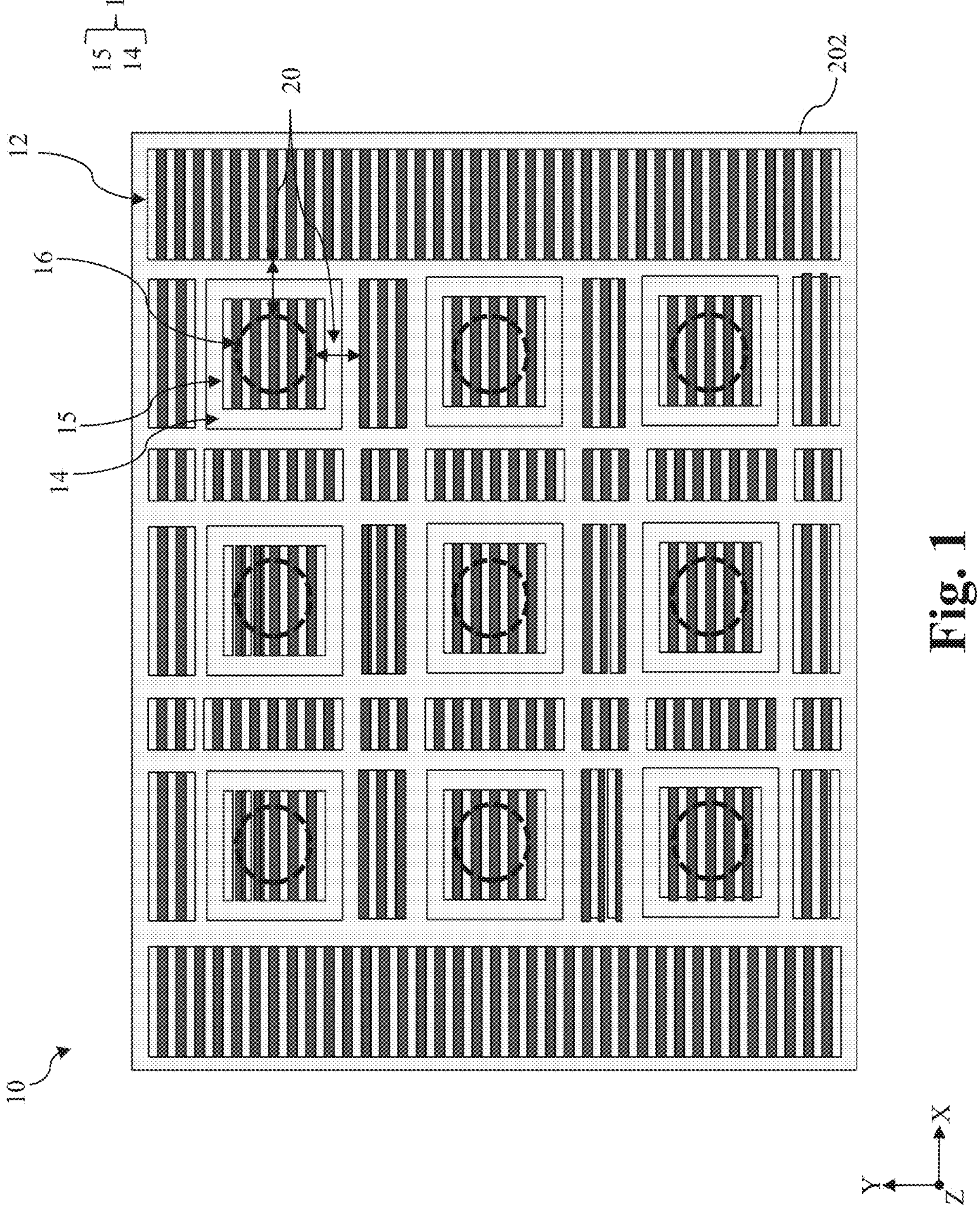
FIG. 1 illustrates a schematic top view of an integrated circuit (IC) die that includes TSV cells and device regions, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +1-15% by one of ordinary skill in the art. Source/drain region(s) may refer to a source or a drain, individually or collectively, dependent upon the context.

Through-silicon or through-substrate vias (TSV) have been developed to provide a vertical interconnect that extends through a substrate and a portion of an interconnect structure to facilitate various device structures, such as CMOS image sensors (CISs), a three-dimensional integrated circuit (3DIC), MEMS devices, radio frequency (RF) devices, wafer-on-wafer (WoW) devices, system on integrated circuit (SoIC) devices and so on. The term TSV in the present disclosure broadly encompasses via structures that provide direct signal routing from a frontside of the substrate and a backside of the substrate or vice versa. During the formation of TSVs, moisture may erode metal materials in regions accommodating TSVs. Protective structures, such as guard rings and buffer zones, have been developed to protect TSVs from moisture attack during manufacturing processes. Further, guard rings may also provide electrical barriers to protect nearby components from electrical interference from current carrying through TSVs. Besides guard rings, buffer zones or enhancement buffer zones may be formed between the TSV and the guard ring to provide additional cushion to prevent stress from the TSV from damaging the surrounding devices. The structure in the buffer zones and formation thereof have been investigated to minimize impact to devices in the device regions.

The present disclosure provides a TSV cell with buffer zones that includes epitaxial features similar to their counterparts in device regions outside the TSV cells. The present disclosure also provides a method to form the TSV cell. In an example process, a work-in-progress (WIP) structure is received that include a TSV cell region and a device region. Fin-shaped structures that include a plurality of first semiconductor layers interleaved by a plurality of second semiconductor layers are formed over the TSV cell region and the device region. Dummy gate stacks are formed over channel regions of the fin-shaped structures. A top gate spacer layer is deposited over the WIP structure, including over the dummy gate stack. Thereafter, source/drain regions of the fin-shaped structure is etched. After the plurality of second semiconductor layers are partially etched to form inner spacer recesses, an inner spacer layer is deposited and etched back to form inner spacer features. A bottom epitaxial layer is deposited over the source/drain regions of the TSV cell regions. Then n-type source/drain feature and p-type source/drain feature are selectively formed over n-type regions and p-type regions. The dummy gate stack is removed to expose sidewall of the second semiconductor layers. The first semiconductor layers are released as channel members after the second semiconductor layers are selectively removed. After the release of the channel members, the example process bifurcate to form a gate structure to wrap around channel members in the device region and a dielectric gate structure for wrap over the channel members in the buffer zone.

Figure 2:
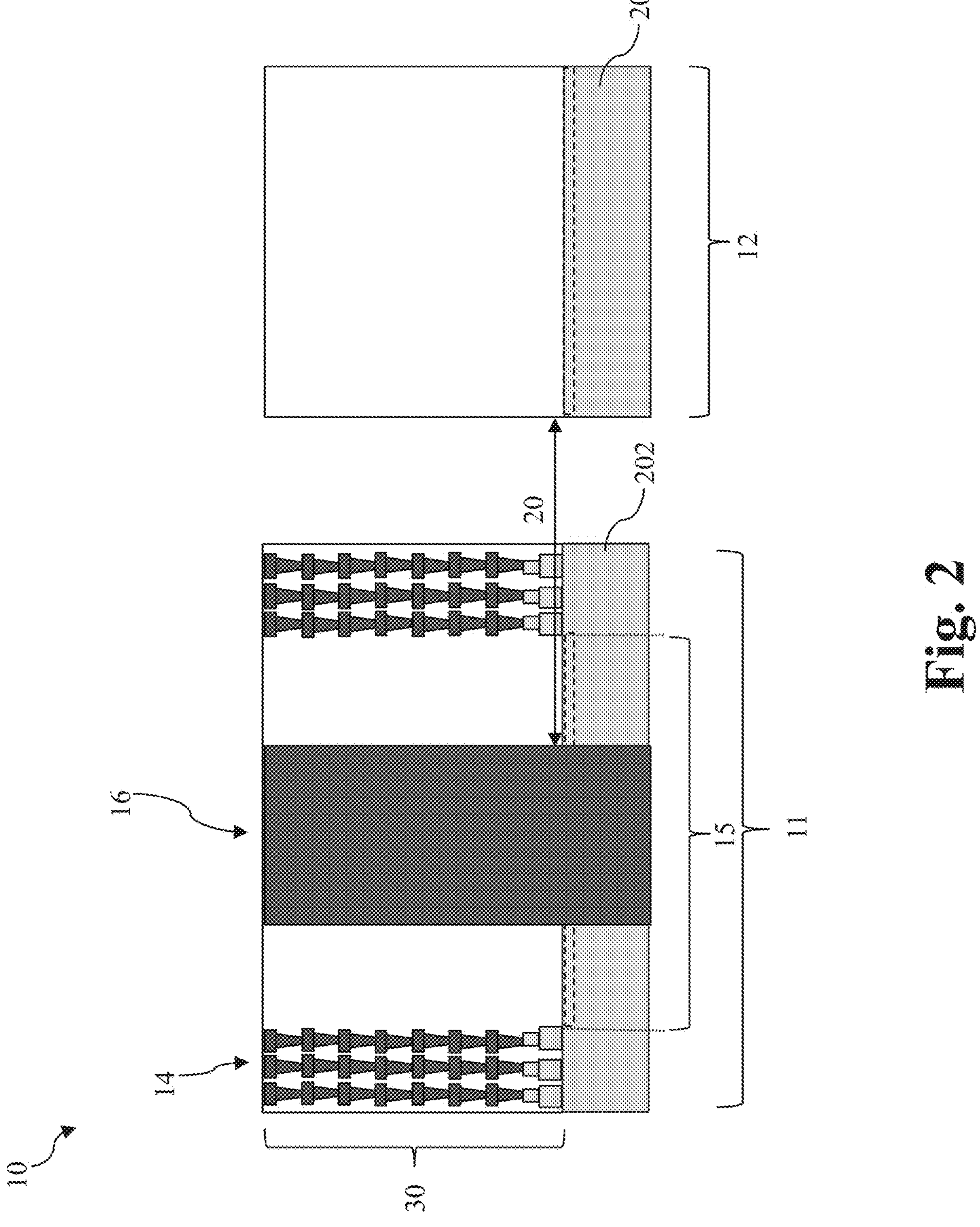
FIG. 2 provides enlarged fragmentary cross-sectional views of a TSV cell and a device region, according to various aspects of the present disclosure.

FIG. 1 illustrates a schematic top view of an integrated circuit (IC) die 10 that includes TSV cells 11 and device region regions 12 over a substrate 202. Each of the TSV cells 11 includes a guard ring 14 that continuously goes around a buffer zone 15. The buffer zone 15 is configured to receive a TSV 16. To be more precise, when the TSV 16 is formed, it extends through the buffer zone 15, as illustrated as dotted lines in FIG. 1. To prevent the stress associated with the TSV 16, the device regions 12 are placed outside a keep-out-zone (KOZ) 20. The dimension of the KOZ 20 is determined by the device structure in the device region 12 as well as the dimensions of the TSV 16. As its name suggests, the TSV 16 extends through the buffer zone 15 and continues through the substrate 202. FIG. 2 provides a fragmentary cross-sectional views of the TSV cell 11 and the device region 12. A frontside interconnect structure 30 is disposed over the substrate 202, including the TSV cell 11 and the device region 12. The guard ring 14 that extends along a perimeter of the buffer zone 15 may include fin-shaped structures, gate ring structures, contact ring structures over the substrate. Additionally, as shown in FIG. 2, the guard ring 14 may further include metal via towers extending through the frontside interconnect structure 30. The TSV 16 extends completely through the substrate 202, the buffer zone 15, and at least partially through the frontside interconnect structure 30. The device region 12 is disposed outside the KOZ 20.

Figure 3:
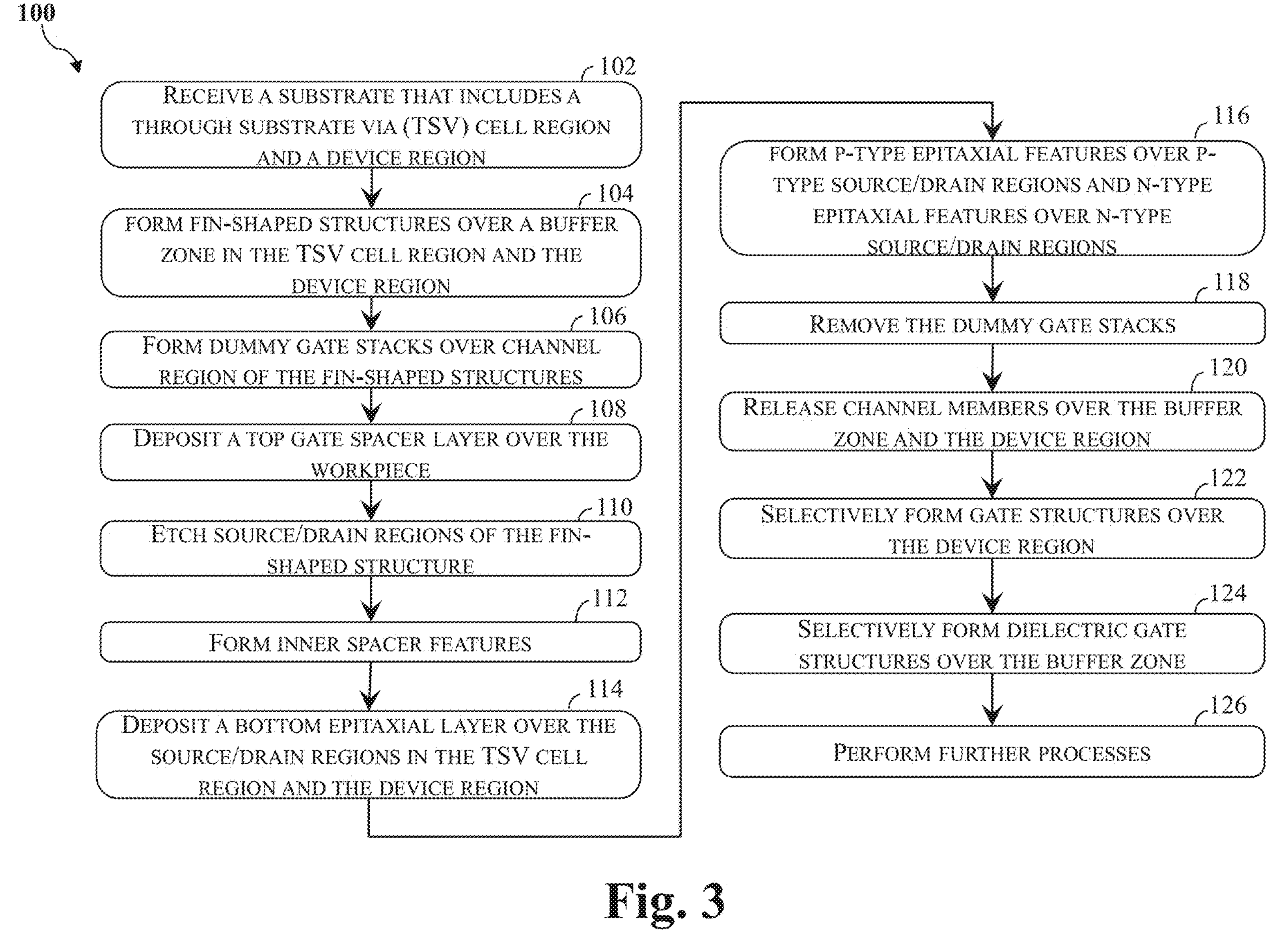
FIG. 3 is a flow chart illustrating an embodiment of a method of forming a device structure and a buffer zone in a TSV cell, according to various aspects of the present disclosure.

FIG. 3 is a flowchart illustrating a method 100 of forming device structures or dummy device structure in the TSV cell 11 and the device region 12 on a substrate 202. Because different operations of the method 100 add different structural features on the substrate 202, the substrate 202 and structures formed thereon may be collectively referred to as a work-in-progress (WIP) structure 200. Method 100 is merely an example and is not intended to limit the present disclosure to what is explicitly illustrated in the method 100. Additional steps can be provided before, during and after the method 100, and some steps described can be replaced, eliminated, or moved around for additional embodiments of the method. Not all steps are described herein in detail for reasons of simplicity. The method 100 is described below in conjunction with FIGS. 4-22, which are fragmentary cross-sectional views of the WIP structure 200 at different stages of fabrication according to various embodiments of the method 100. Because the WIP structure 200 will be fabricated into a device structure, the WIP structure 200 may be referred to herein as a device structure 200 as the context requires. For avoidance of doubts, the X, Y and Z directions in FIGS. 4-22 are perpendicular to one another. Throughout the present disclosure, unless expressly otherwise described, like reference numerals denote like features.

Referring to FIGS. 3 and 1, method 100 includes a block 102 where a substrate 202 is received. The substrate 202 includes a TSV cell 11 (or TSV cell region 11) and a device 12. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenide (As). In embodiments where the semiconductor device is n-type, a p-type doping profile (i.e., a p-type well or p-well) may be formed on the substrate 202. In some implementations, the p-type dopant for forming the p-type well may include boron (B) or gallium (Ga). The suitable doping may be performed using ion implantation of dopants and/or diffusion processes. The substrate 202 may also include other semiconductors such as germanium (SiGe), silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features. As shown in FIG. 1, depending on locations of the TSVs in the design, the substrate 202 may include TSV cell regions 11 and device regions 12. As described above, device regions 12 are disposed outside keep out zones with respect to boundaries of the planned TSVs. The TSV cell region 11 includes a guard ring 14, a buffer zone 15, and a TSV 16 (or a cite for the TSV 16).

Figure 4:
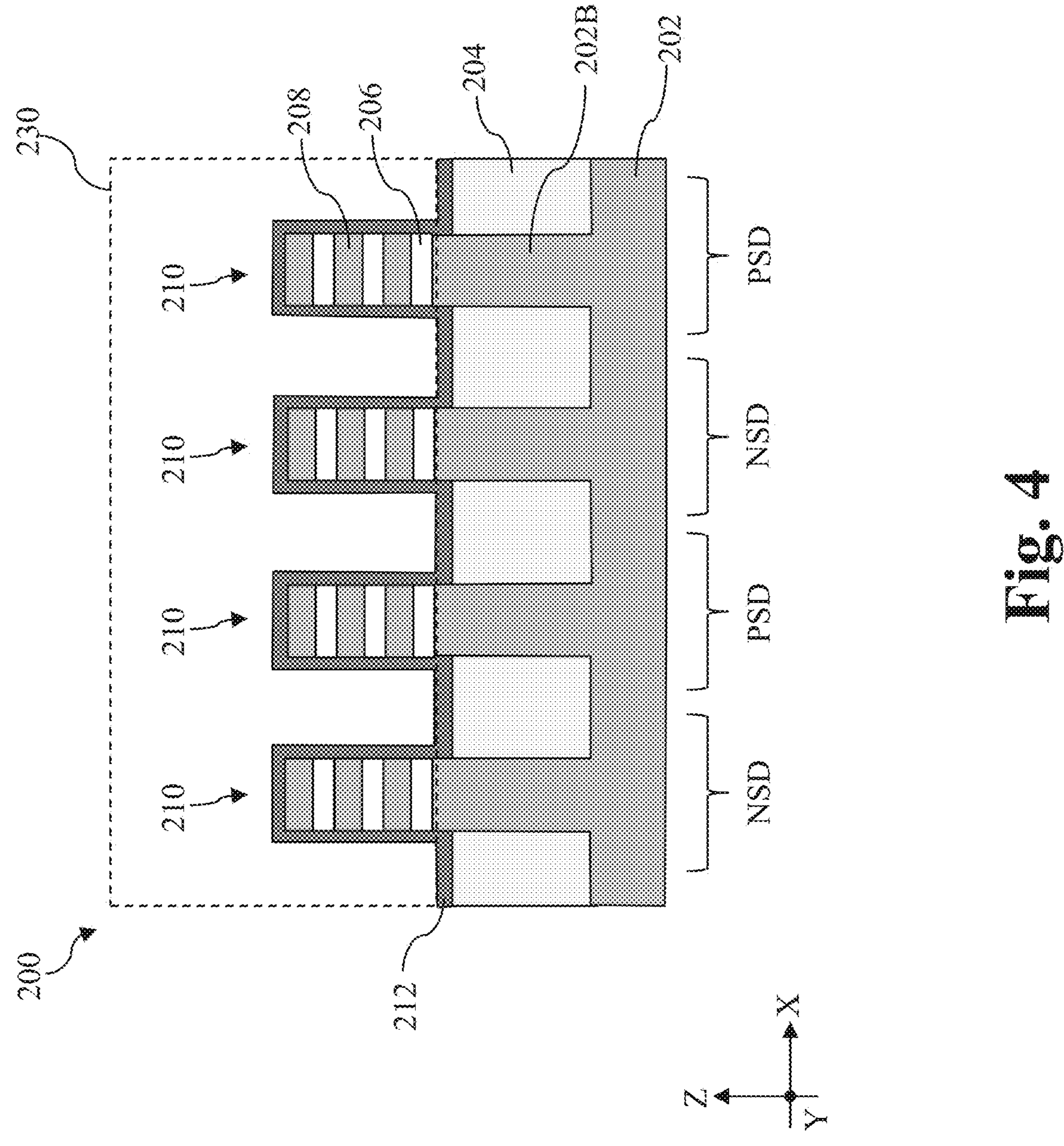
FIGS. 4-18 are fragmentary cross-sectional views of a work-in-progress (WIP) structure undergoing operations of the method in FIG. 3, according to various aspects of the present disclosure.

Referring still to FIGS. 3 and 4, method 100 includes a block 104 where fin-shaped structures 210 are over the buffer zone 15 and the device region 12. As shown in FIG. 4, each of the fin-shaped structures 210 include channel layers 208 interleaved by sacrificial layers 206. Although the details are not explicitly shown in FIG. 4, the fin-shaped structures 210 are patterned from a stack deposited on the substrate 202. The stack includes a plurality of the channel layers 208 interleaved by a plurality of the sacrificial layers 206. Each of the fin-shaped structures 210 is patterned from the stack and a portion of the substrate 202. As illustrated in FIG. 4, each of the fin-shaped structures 210 includes a base fin 202B that is formed from the substrate 202. While not explicitly shown in FIG. 4, the fin-shaped structures 210 are similarly formed in the buffer zones 15 and the device regions 12. The similar dimensions help maintain a homogeneous process environment for the formation of the functional devices in the device region 12. The front-end-of-line (FEOL) structures in the guard ring 14 may be large in dimensions as compared to those in the buffer zone 15 or the device region 12.

In some embodiments, the sacrificial layers 206 are of a first semiconductor composition and the channel layers 208 are of a second semiconductor composition. The first and second semiconductor composition may be different. In some embodiments, the sacrificial layers 206 include silicon germanium (SiGe) and the channel layers 208 include silicon (Si). It is noted that three (3) layers of the sacrificial layers 206 and three (3) layers of the channel layers 208 are alternately arranged as illustrated in FIG. 4, which is for illustrative purposes only and not intended to be limiting beyond what is specifically recited in the claims. It can be appreciated that any number of epitaxial layers may be formed in the stack. The number of layers depends on the desired number of channels members for the semiconductor device 200. In some embodiments, the number of channel layers 208 is between 2 and 10.

In some embodiments, all sacrificial layers 206 may have a substantially uniform first thickness and all of the channel layers 208 may have a substantially uniform second thickness. The first thickness and the second thickness may be the same or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance (along the Z direction) between adjacent channel region(s) for a subsequently-formed multi-gate device and the thickness of each of the sacrificial layers 206 is chosen based on device performance considerations.

The layers in the stack may be deposited using a molecular beam epitaxy (MBE) process, a vapor phase epitaxy (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth processes for the stack.

To pattern the stack and the substrate 202 to form the fin-shaped structures, a hard mask layer may be deposited over the stack to form an etch mask. The hard mask layer may be a single layer or a multi-layer. For example, the hard mask layer may include a pad oxide layer and a pad nitride layer over the pad oxide layer. The fin-shaped structure 210 may be patterned from the stack and a portion of the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 4, the etch process at block 104 forms trenches extending through the stack and a portion of the substrate 202. The trenches define the fin-shaped structures 210. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 210 by etching the stack. As shown in FIG. 3, the fin-shaped structure 210, along with the sacrificial layers 206 and the channel layers 208 therein, extends vertically along the Z direction and lengthwise along the X direction.

An isolation feature 204 is formed adjacent the fin-shaped structure 210. In some embodiments, the isolation feature 204 may be formed in the trenches to isolate the fin-shaped structures 210 from a neighboring active region. The isolation feature 204 may also be referred to as a shallow trench isolation (STI) feature 204. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 204. The fin-shaped structure 210 rises above the STI feature 204 after the recessing.

Referring to FIGS. 3 and 4, method 100 includes a block 106 where a dummy gate stack 230 is formed over channel regions of the fin-shaped structures 210. In some embodiments, a gate replacement process (or gate-last process) is adopted where the dummy gate stack 230 (shown in FIGS. 4 and 13) serves as a placeholder to undergo various processes and is to be removed and replaced by the functional gate structure. Other processes and configuration are possible. The fin-shaped structures 210 in FIG. 4 extend lengthwise in parallel along the Y direction while the dummy gate stack 230 extends lengthwise along the X direction. In some embodiments illustrated in FIG. 4, the dummy gate stack 230 is formed over the fin-shaped structure 210 and the fin-shaped structure 210 may be divided into channel regions underlying the dummy gate stacks 230 and source/drain regions that do not underlie the dummy gate stacks 230. In the depicted embodiments, the fin-shaped structures 210 serve as active regions for n-type devices or p-type devices. N-type source/drain regions are denoted as NSD and p-type source/drain regions are denoted as PSD. Additionally, because the cross-section in FIG. 4 cuts through the source/drain regions of the fin-shaped structures 210, the dummy gate stack 230 is out of plane and its profile is shown in dotted lines.

The formation of the dummy gate stack 230 may include deposition of layers in the dummy gate stack 230 and patterning of these layers. In an example illustrated in FIG. 13, the dummy gate stack 230 may include a dummy dielectric layer and a dummy electrode layer. For patterning purposes, the dummy gate stack 230 may be capped by a first gate-top hard mask layer 232 and a second gate-top hard mask layer 234. These layers may be blanketly deposited over the WIP structure 200. In some embodiments, the dummy dielectric layer may be deposited on the fin-shaped structure 210 using a chemical vapor deposition (CVD) process, an atomic layer deposition (ALD) process, an oxygen plasma oxidation process, or other suitable processes. In some instances, the dummy dielectric layer may include silicon oxide. Thereafter, the dummy electrode layer may be deposited over the dummy dielectric layer using a CVD process, an ALD process, or other suitable processes. In some instances, the dummy electrode layer may include polysilicon (poli-Si). For patterning purposes, the first and second gate-top hard mask layers 232 and 234 may be deposited on the dummy electrode layer using a CVD process, an ALD process, or other suitable processes. The second gate-top hard mask layer 234, the first gate-top hard mask layer 232, the dummy electrode layer and the dummy dielectric layer may then be patterned to form the dummy gate stack 230. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the first gate-top hard mask layer 232 may include silicon oxide and the second gate-top hard mask layer 234 may include silicon nitride.

Referring to FIGS. 3 and 4, method 100 includes a block 108 where a top spacer layer 212 is deposited over the dummy gate stack 230. In some embodiments, the top spacer layer 212 is deposited conformally over the WIP structure 200, including over top surfaces and sidewalls of the dummy gate stack 230. The term "conformally" may be used herein for ease of description of a layer having substantially uniform thickness over various regions. The top spacer layer 212 may be a single layer or a multi-layer. The top spacer layer 212 may include silicon carbonitride, silicon oxycarbide, silicon oxycarbonitride, or silicon nitride. In some implementations, the top spacer layer 212 may be deposited over the dummy gate stack 230 using processes such as, a CVD process, a subatmospheric CVD (SACVD) process, an ALD process, or other suitable process. As shown in FIG. 4, at block 108, the top spacer layer 212 is also conformally deposited over the n-type source/drain regions NSD and p-type source/drain regions PSD of the fin-shaped structures 210.

Figure 5:
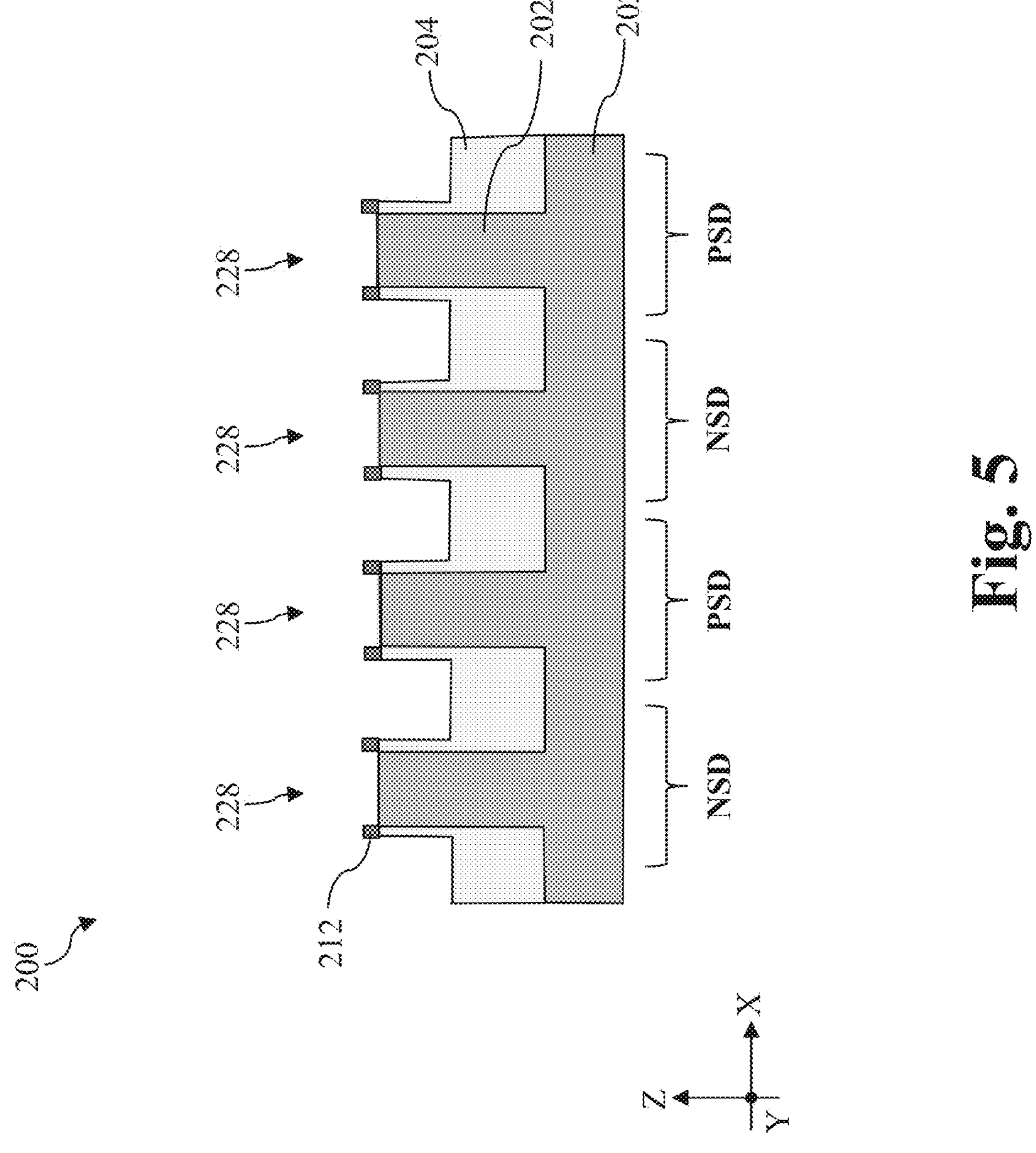

Referring to FIGS. 3 and 5, method 100 includes a block 110 where source/drain regions of the fin-shaped structures 210 are recessed to form source/drain recesses. As shown in FIG. 5, the source/drain regions (NSD or PSD) that are not covered by the dummy gate stack 230 are anisotropically etched by a dry etch or a suitable etching process to form the source/drain trenches 228. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The source/drain regions (NSD or PSD) of the fin-shaped structure 210 are recessed to expose sidewalls of the sacrificial layers 206 and the channel layers 208. In some implementations, the source/drain trenches 228 may extend below the stack into the substrate 202. As shown in FIG. 5, the sacrificial layers 206 and channel layers 208 in the source/drain region (NSD or PSD) are removed at block 110, exposing the substrate 202 and sidewalls of the sacrificial layers 206 and channel layers 208 in the channel region. In the course of forming the source/drain recesses, the anisotropic dry etch at block 110 also removes top-facing portions of the top spacer layer 212 and creates recesses in the STI feature 204. In FIG. 5, a leftover portion of the top spacer layer 212 may remain on the WIP structure 200. Because the leftover portion of the top spacer layer 212 blocks the line of sight of the anisotropic etching, a portion of the STI feature 204 below the leftover portion of the top spacer layer 212 may remain after the source/drain recesses are formed.

Figure 6:
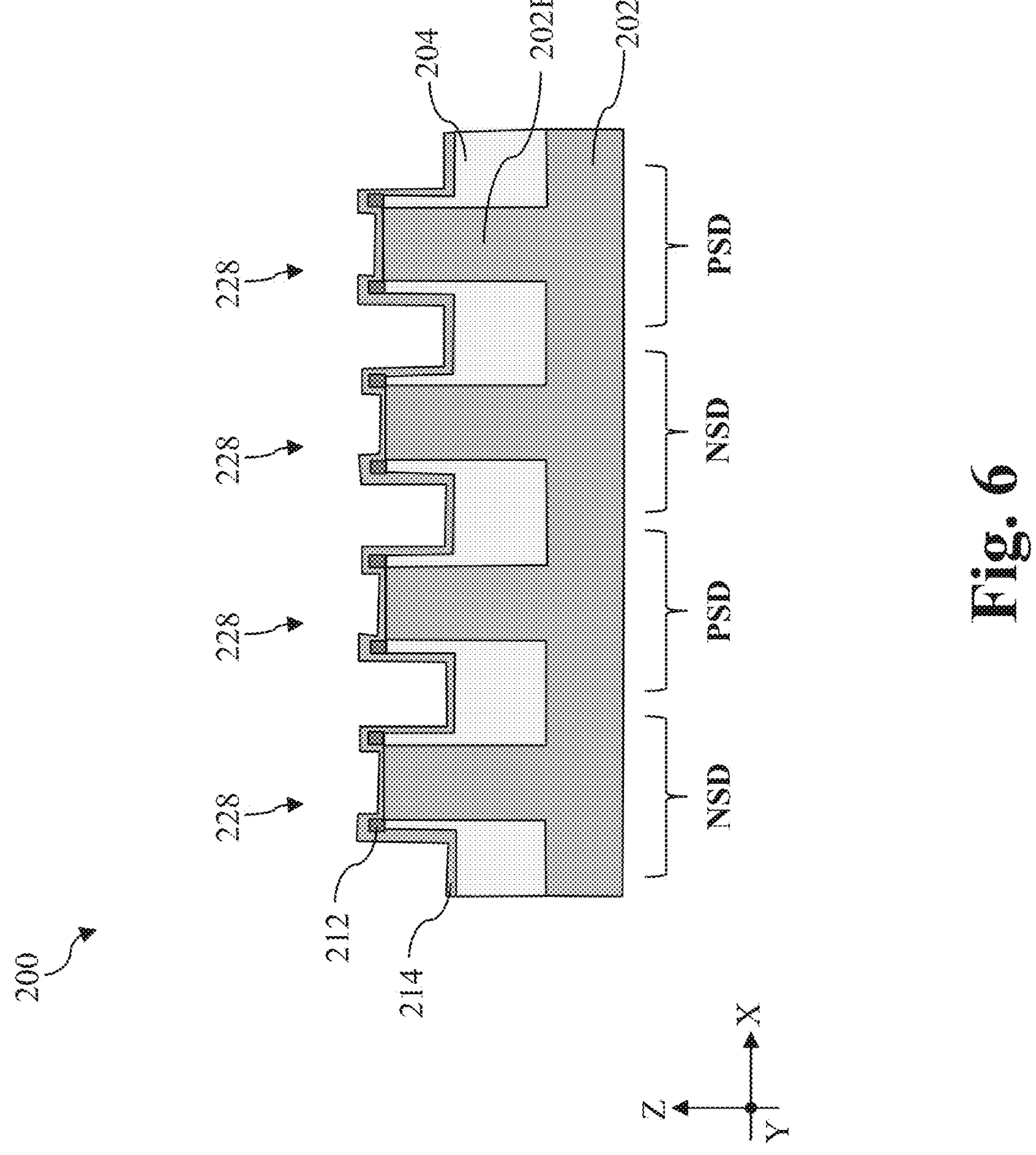

Referring to FIGS. 3 and 6, method 100 includes a block 112 where inner spacer features 214 are formed. While not shown explicitly, operation at block 112 may include selective and partial removal of the sacrificial layers 206 to form inner spacer recesses, deposition of inner spacer material over the WIP structure 200, and etch back the inner spacer material to form inner spacer features 214 in the inner spacer recesses (shown in FIG. 13). The sacrificial layers 206 exposed in the source/drain trenches 228 are selectively and partially recessed to form inner spacer recesses while the top spacer layer 212, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. The selective and partial recess of the sacrificial layers 206 may include a SiGe oxidation process followed by a SiGe oxide removal. In that embodiments, the SiGe oxidation process may include use of ozone. In some other embodiments, the selective dry etching process may include use of one or more fluorine-based etchants, such as fluorine gas or hydrofluorocarbons. The selective wet etching process may include an APM etch (e.g., ammonia hydroxide-hydrogen peroxide-water mixture).

Figure 7:
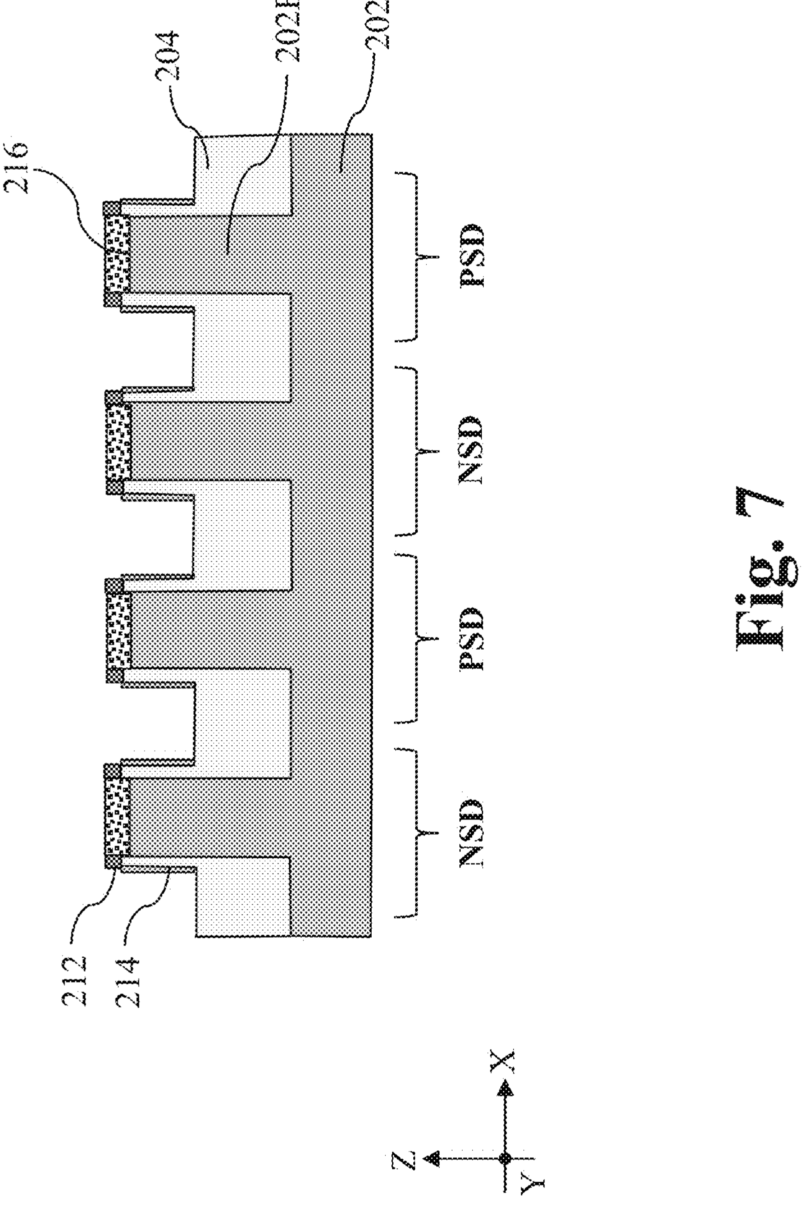
Figure 13:
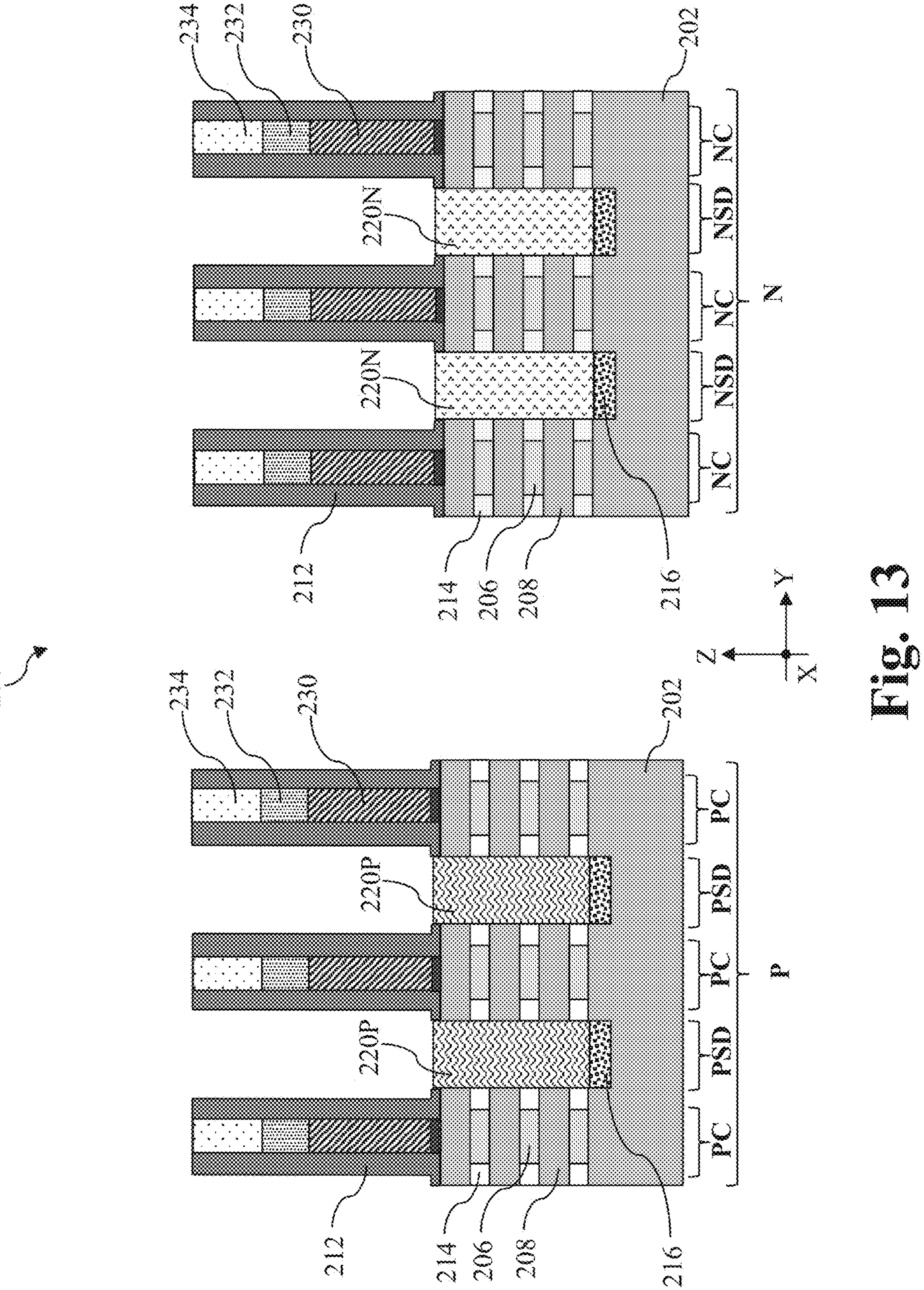

Referring to FIG. 6, after the inner spacer recesses are formed, the inner spacer material 214 is deposited over the WIP structure 200, including over the inner spacer recesses. The inner spacer material 214 may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material 214 may be a single layer or a multilayer. In some implementations, the inner spacer material 214 may be deposited using CVD, PECVD, SACVD, ALD or other suitable methods. The inner spacer material 214 is deposited into the inner spacer recesses as well as over the sidewalls of the channel layers 208 exposed in the source/drain trenches 228. Referring to FIG. 7, the deposited inner spacer material 214 is then etched back to remove the inner spacer material 214 from the sidewalls of the channel layers 208 to form the inner spacer features 214. At block 112, the inner spacer material 214 may also be removed from the top surfaces and/or sidewalls of the top spacer layer 212. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 13, each of the inner spacer features 214 is in direct contact with the recessed sacrificial layers 206 and is disposed between two neighboring channel layers 208. That is, the inner spacer features 214 interleave the channel layers 208.

Referring to FIGS. 3 and 7, method 100 includes a block 114 where a bottom epitaxial layer 216 is deposited over the source/drain regions in the buffer zones 15 and the device region 12. In some embodiments, the bottom epitaxial layer 216 includes an undoped semiconductor layer, such as an undoped silicon (Si) layer, an undoped silicon germanium (SiGe) layer, or an undoped germanium (Ge) layer. In one embodiment, the bottom epitaxial layer 216 includes an undoped silicon layer. As used herein, an undoped semiconductor layer refers to a semiconductor layer that is not intentionally doped. In an example process, the bottom epitaxial layer 216 is epitaxially deposited over the WIP structure 200 using MBE, VPE process, and/or other suitable epitaxial growth processes. Due to the crystalline orientation, the bottom epitaxial layer 216 deposited on the exposed top surface of the substrate 202 possess less defect. This allows the bottom epitaxial layer 216 to be selectively removed from surfaces other than the exposed top surface of the substrate 202.

Referring to FIGS. 3 and 8-13, method 100 includes a block 116 where p-type source/drain features 220P and n-type source/drain features 220N are formed. Operations in block 116 may include selectively depositing a first pattern film 218 over the n-type source/drain regions NSD (shown in FIG. 8), depositing p-type source/drain features 220P over the p-type source/drain regions PSD (shown in FIG. 9), selectively depositing a second pattern film 222 over the p-type source/drain features 220P (shown in FIG. 10), depositing n-type source/drain features 220N over the n-type source/drain regions NSD (shown in FIG. 11), removing the second pattern film 222 (shown in FIG. 12).

Figure 8:
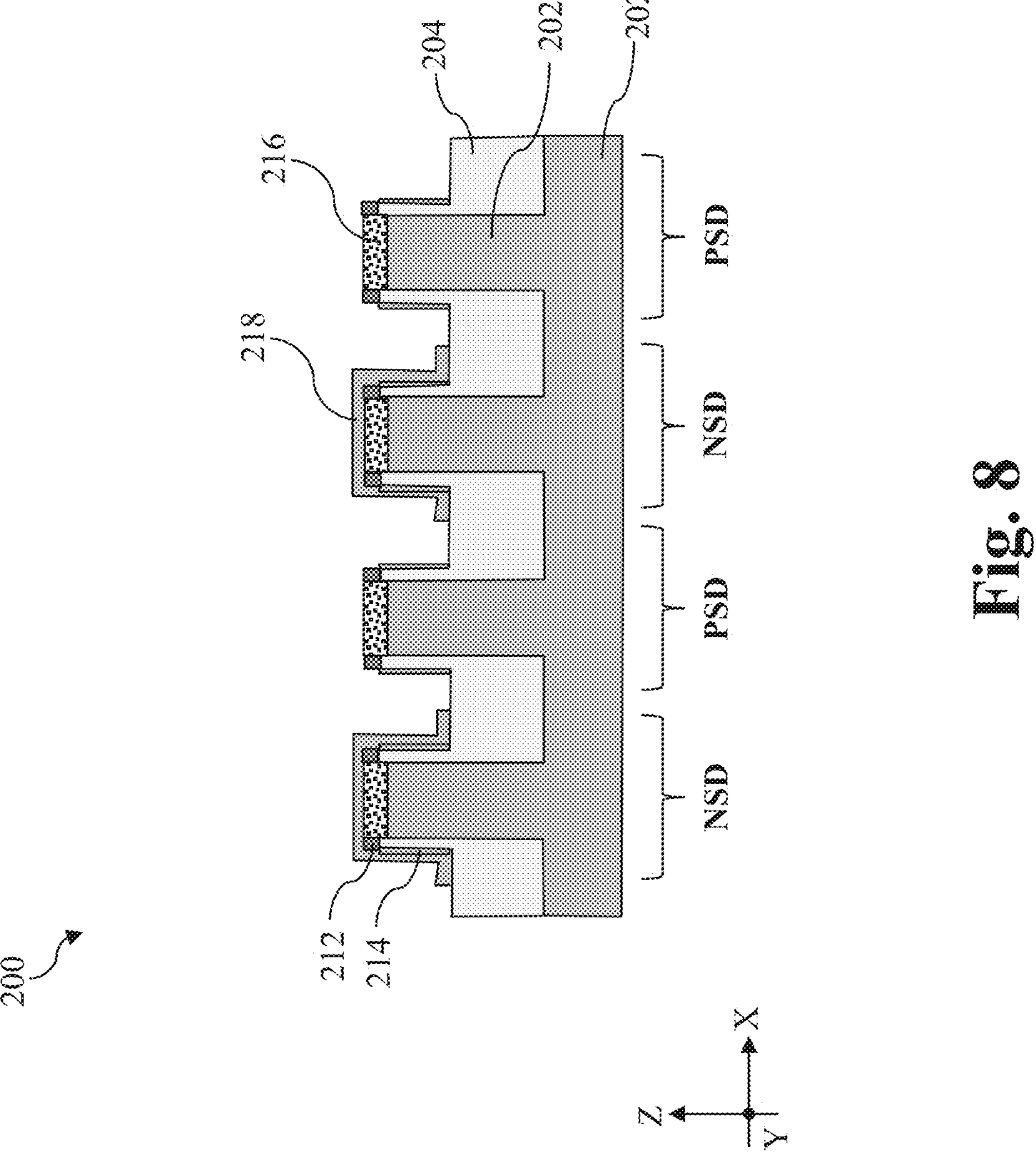
Figure 9:
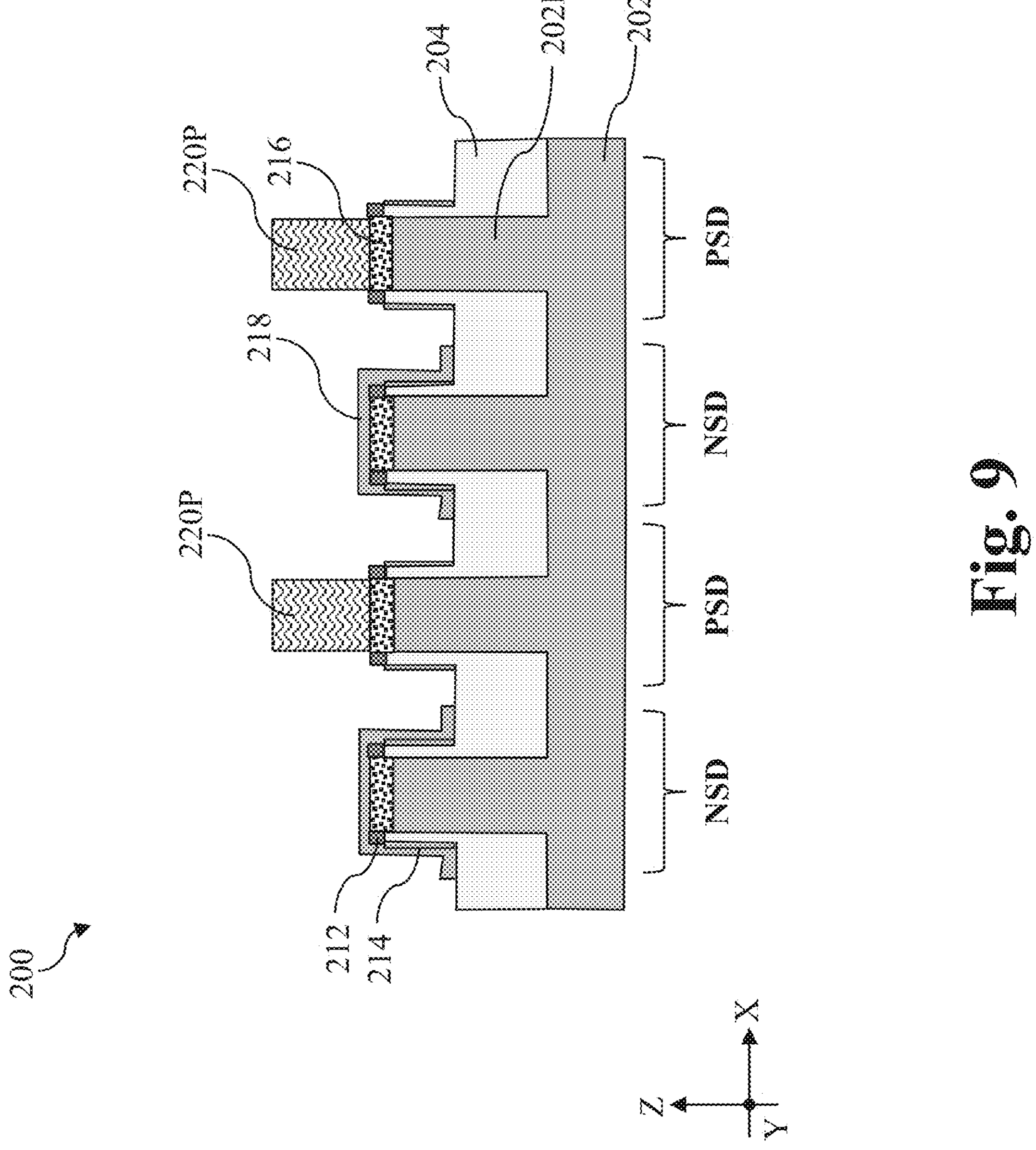

Referring to FIG. 8, photolithography processes may be used to cover the p-type source/drain regions PSD with a patterned photoresist when the first pattern film 218 is deposited over the n-type source/drain regions NSD. In some instances, the first pattern film 218 may include aluminum oxide, which allows it to be selectively removed without substantially damaging structures formed with silicon oxide, silicon nitride, or semiconductor materials. With the first pattern film 218 covering the n-type source/drain regions NSD, p-type source/drain features 220P are selectively deposited over the bottom epitaxial layer 216 in p-type source/drain regions PSD, as shown in FIG. 9. The p-type source/drain features 220P may include silicon germanium (SiGe) and a p-type dopant, such as boron (B). Suitable epitaxial processes for the p-type source/drain features 220P include vapor-phase epitaxy (VPE), ultra-high vacuum CVD (UHV-CVD), molecular beam epitaxy (MBE), and/or other suitable processes. After the formation of the p-type source/drain features 220P, the first pattern film 218 may be removed from the n-type source/drain regions NSD.

Figure 10:
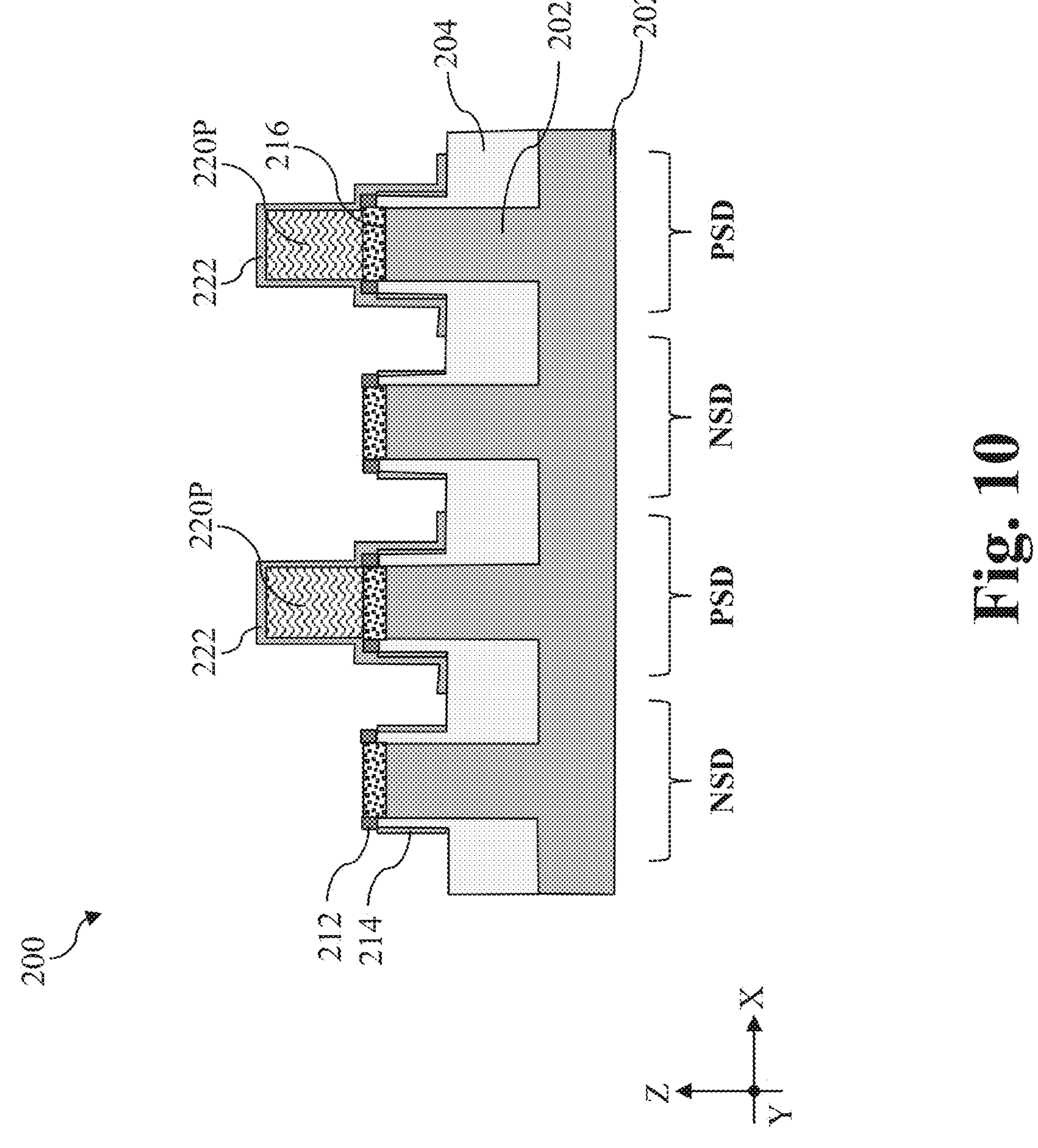
Figure 11:
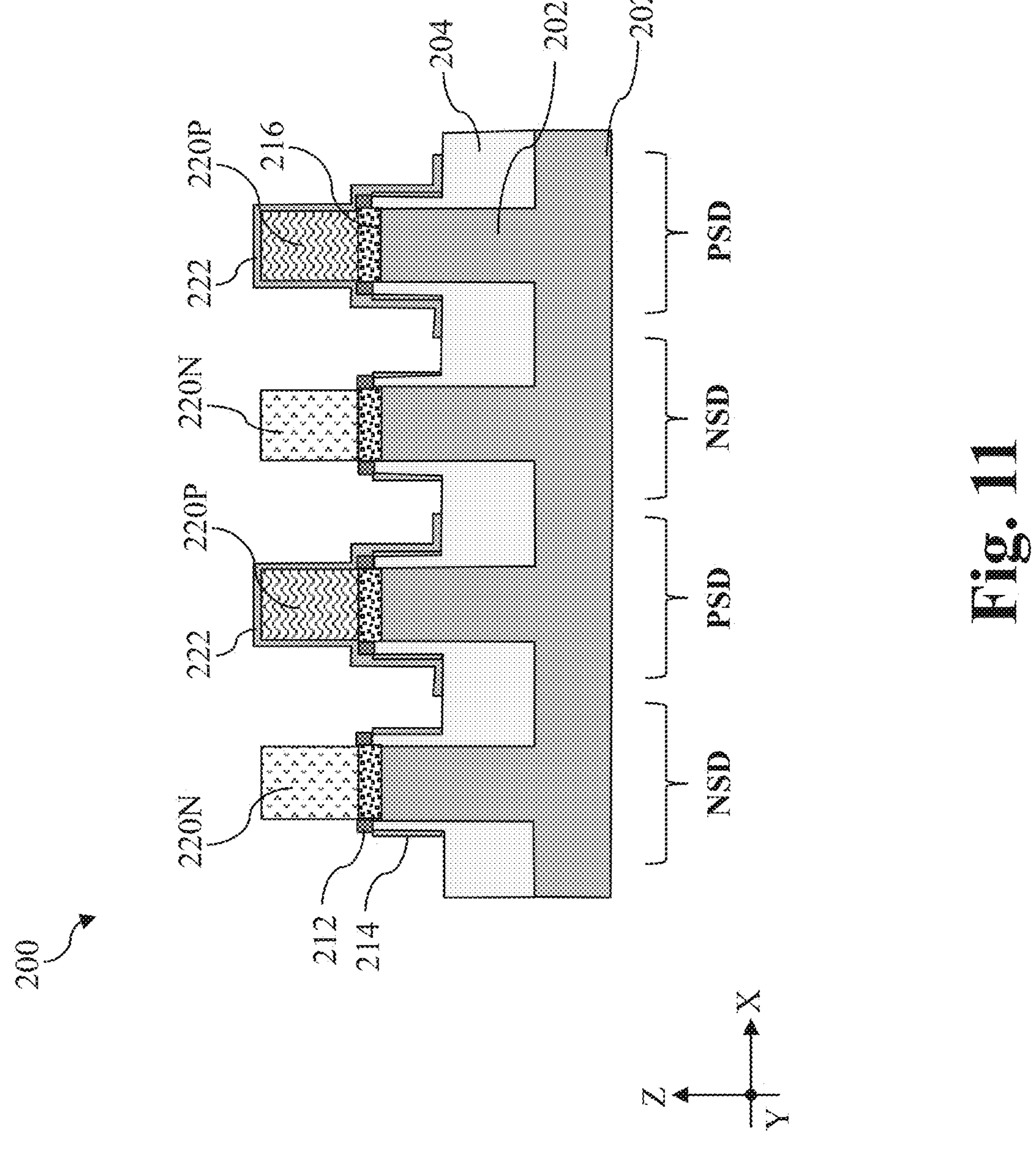
Figure 12:
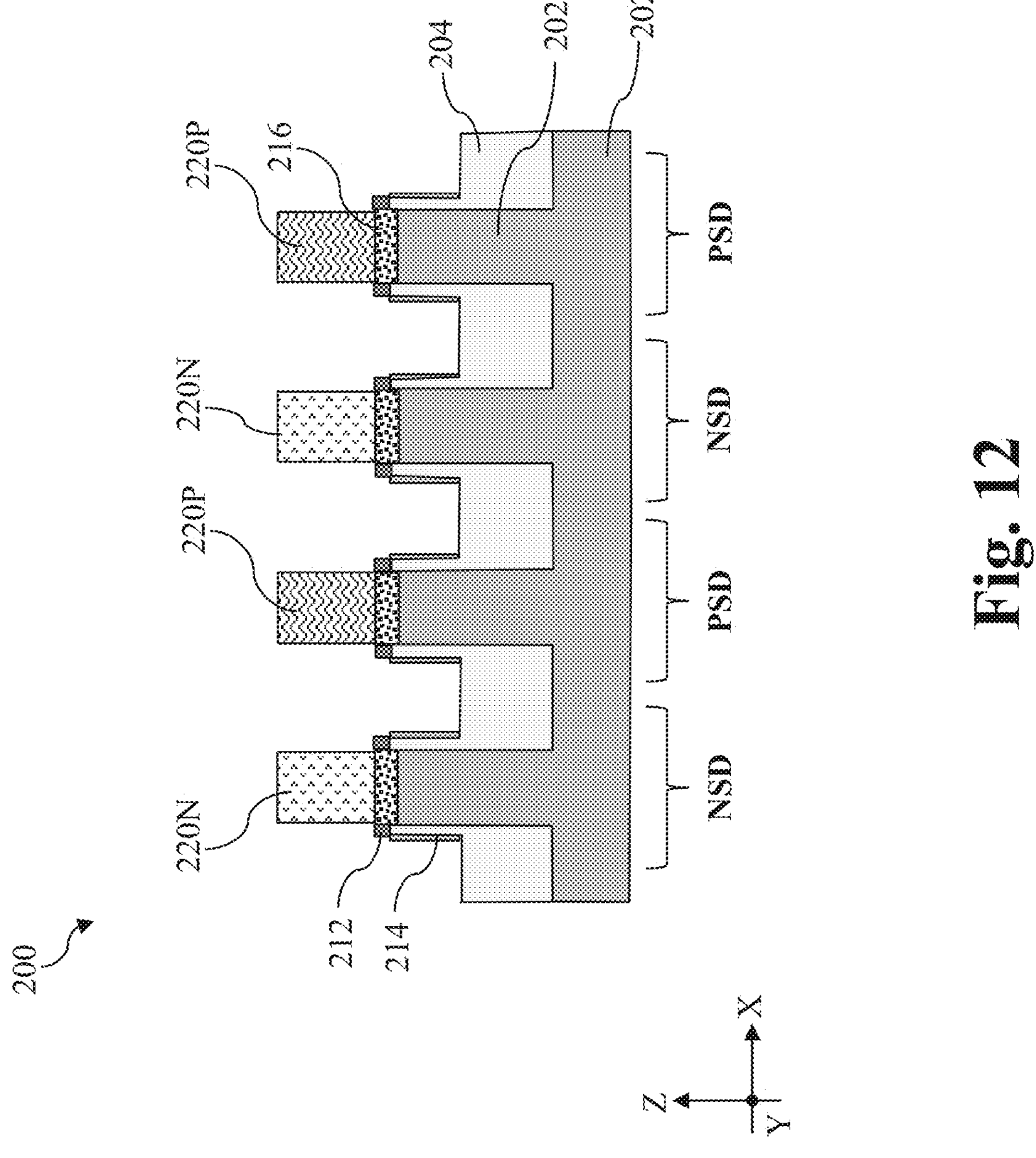

Referring to FIG. 10, after the removal of the first pattern film 218, the second pattern film 222 is selectively formed to cover the p-type source/drain regions PSD, including the p-type source/drain features 220P formed thereover. In some instances, the second pattern film 222 may include aluminum oxide, which allows it to be selectively removed without substantially damaging structures formed with silicon oxide, silicon nitride, or semiconductor materials. With the second pattern film 222 covering the p-type source/drain regions PSD, n-type source/drain features 220N are selectively deposited over the bottom epitaxial layer 216 in n-type source/drain regions NSD, as shown in FIG. 11. The n-type source/drain features 220N may include silicon (Si) and an n-type dopant, such as phosphorus (P) or arsenic (As). Suitable epitaxial processes for the n-type source/drain features 220N include vapor-phase epitaxy (VPE), ultra-high vacuum CVD (UHV-CVD), molecular beam epitaxy (MBE), and/or other suitable processes. After the formation of the N-type source/drain features 220N, the second pattern film 222 may be removed from the p-type source/drain regions PSD, as shown in FIG. 12.

In some implementation, an anneal process may be performed to anneal the p-type source/drain features 220P and the n-type source/drain features 220N. The anneal process may include a rapid thermal anneal (RTA) process, a laser spike anneal process, a flash anneal process, or a furnace anneal process. In some instances, the anneal process may include a peak anneal temperature between about 900° C. and about 1000° C. In these implementations, the peak anneal temperature may be maintained for a duration measured by seconds or microseconds. Throughout the anneal process, a desired electronic contribution of the dopant (such as p-type dopant boron (B) or n-type dopant phosphorus (P)) in the semiconductor host, such as silicon (Si) or silicon germanium (SiGe), may be obtained. The anneal process may generate vacancies that facilitate movement of the p-type dopant from interstitial sites to substitutional lattice sites and reduce damages or defects in the lattice of the semiconductor host.

FIG. 13 provides Y-directional cross-sectional views cutting across an n-type device region N and a p-type device region P. After the operations at block 116, each of the p-type source/drain features 220P is sandwiched between two p-type channel regions PC. Each of the p-type channel regions PC include channel layers 208 interleaved by sacrificial layers 206 and the inner spacer features 214. Similarly, each of the n-type source/drain features 220N is sandwiched between two n-type channel regions NC. Each of the n-type channel regions NC include channel layers 208 interleaved by sacrificial layers 206 and the inner spacer features 214. Please note that the same precursor structures are also formed in the buffer zones 15. As will be described in further detail below, the buffer zones 15 may include counterparts of the p-type source/drain features 220P and n-type source/drain features 220N. Because these counterparts in the buffer zones 15 do not serve functions of the source and drain, they may be referred to as n-type epitaxial features 220N or p-type epitaxial features 220P.

Figure 14:
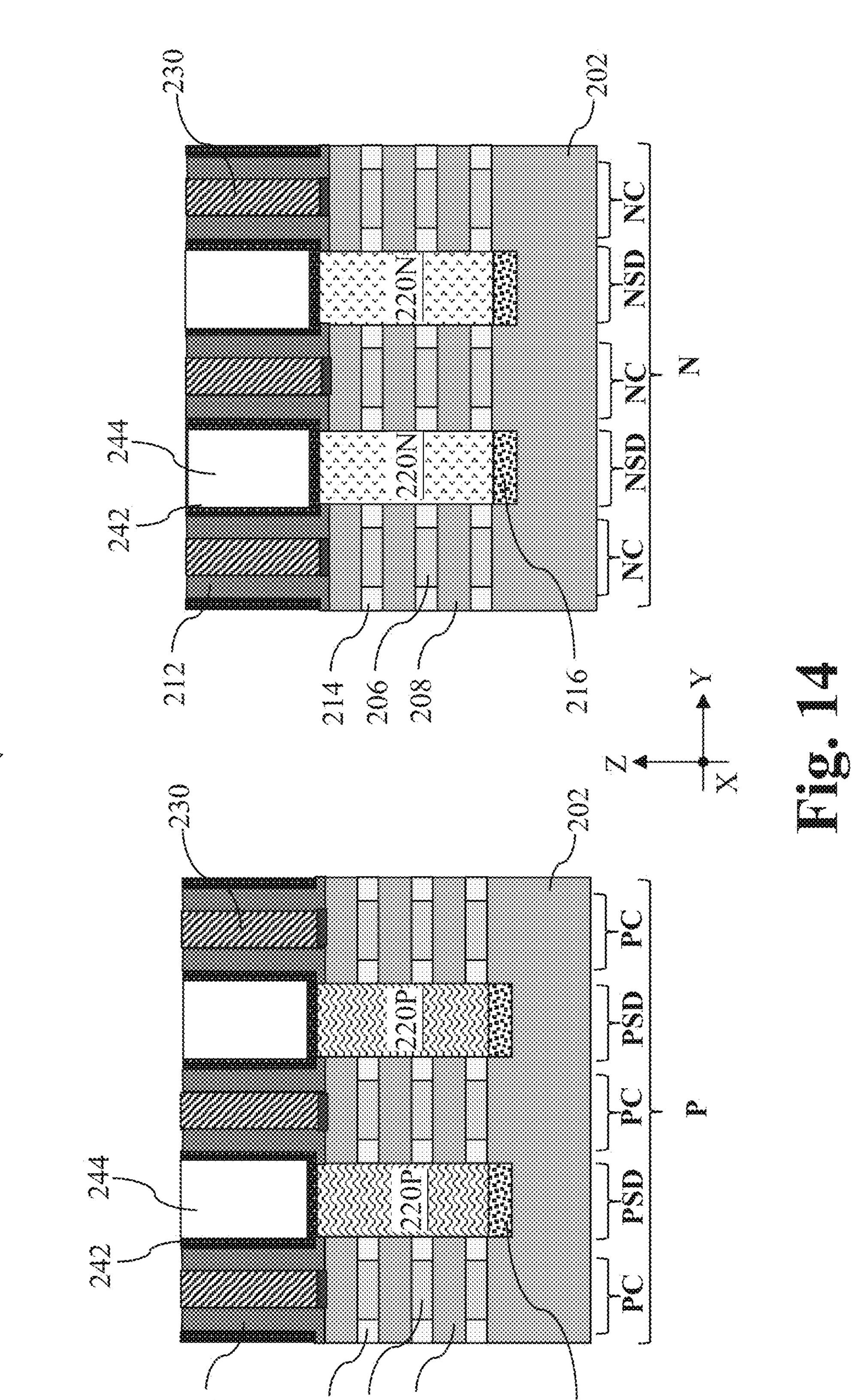
Figure 15:
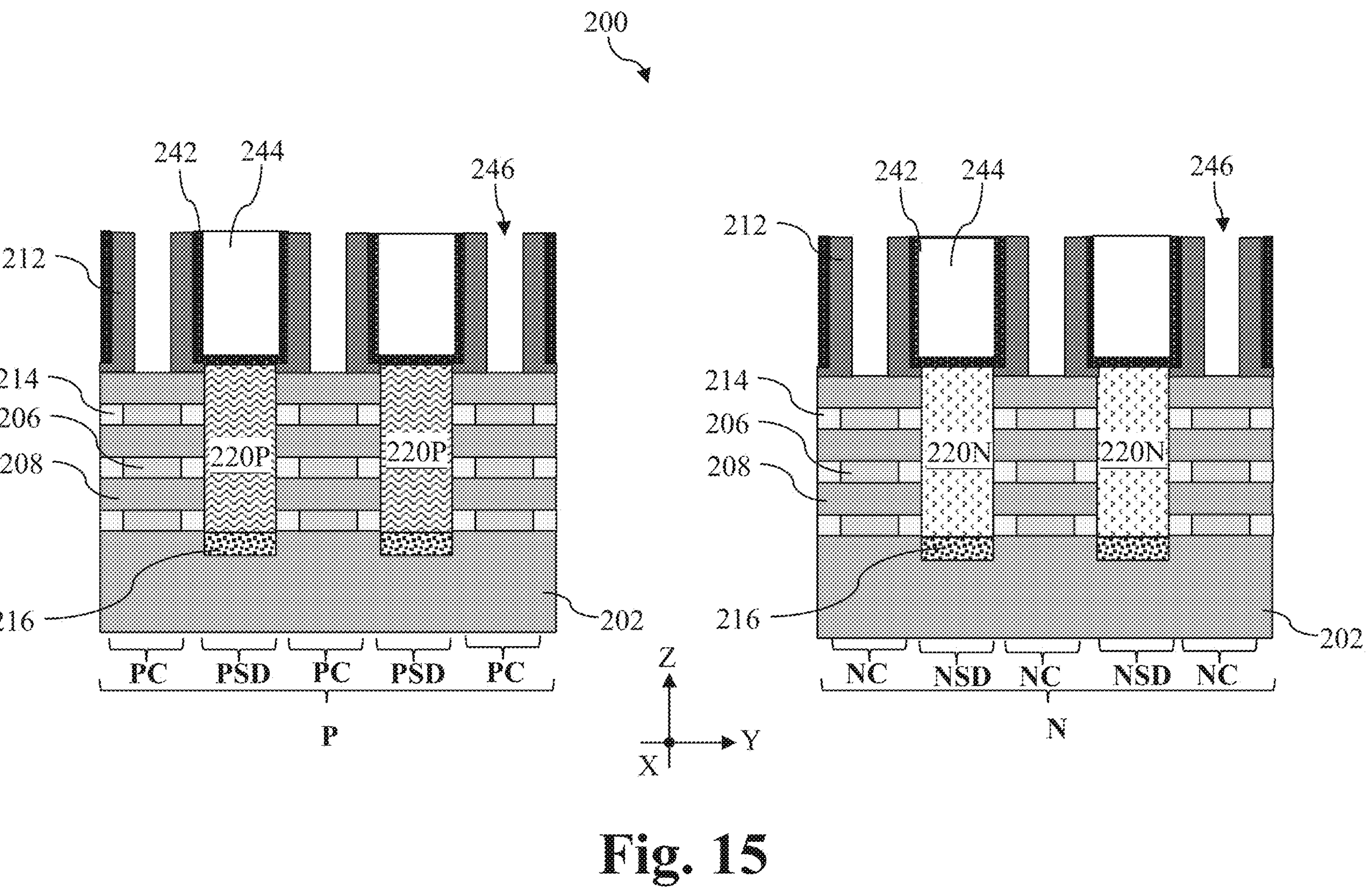

Referring to FIGS. 3, 14 and 15, method 100 includes a block 118 where the dummy gate stack 230 is removed. Operations at block 118 may include deposition of a contact etch stop layer (CESL) 242 over the WIP structure 200 (shown in FIG. 14), deposition of an interlayer dielectric (ILD) layer 244 over the CESL 242 (shown in FIG. 14), and removal of the dummy gate stack 230 (shown in FIG. 15). Referring now to FIG. 15, the CESL 242 is deposited prior to deposition of the ILD layer 244. In some examples, the CESL 242 includes silicon nitride, silicon oxynitride, and/or other materials known in the art. The CESL 242 may be formed by ALD, plasma-enhanced chemical vapor deposition (PECVD) process and/or other suitable deposition processes. The ILD layer 244 is then deposited over the CESL 242. In some embodiments, the ILD layer 244 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by a PECVD process or other suitable deposition technique. In some embodiments, after formation of the ILD layer 244, the WIP structure 200 may be annealed to improve integrity of the ILD layer 244. As shown in FIG. 14, the CESL 242 may be disposed directly on top surfaces of the p-type source/drain features 220P in the p-type device region P and the n-type source/drain features 220N in the n-type device region N.

Referring still to FIG. 14, after the deposition of the CESL 242 and the ILD layer 244, the WIP structure 200 may be planarized by a planarization process to expose the dummy gate stack 230. For example, the planarization process may include a chemical mechanical planarization (CMP) process. Exposure of the dummy gate stack 230 allows the removal of the dummy gate stack 230, as illustrated in FIG. 15. In some embodiments, the removal of the dummy gate stack 230 results in a gate trench 246 over the n-type and p-type channel regions NC and PC. The removal of the dummy gate stack 230 may include one or more etching processes that are selective to the material of the dummy gate stack 230. For example, the removal of the dummy gate stack 230 may be performed using as a selective wet etch, a selective dry etch, or a combination thereof that is selective to the dummy gate stack 230. After the removal of the dummy gate stack 230, sidewalls of the channel layers 208 and the sacrificial layers 206 in the channel regions NC and PC are exposed in the gate trench 246.

Figure 16:
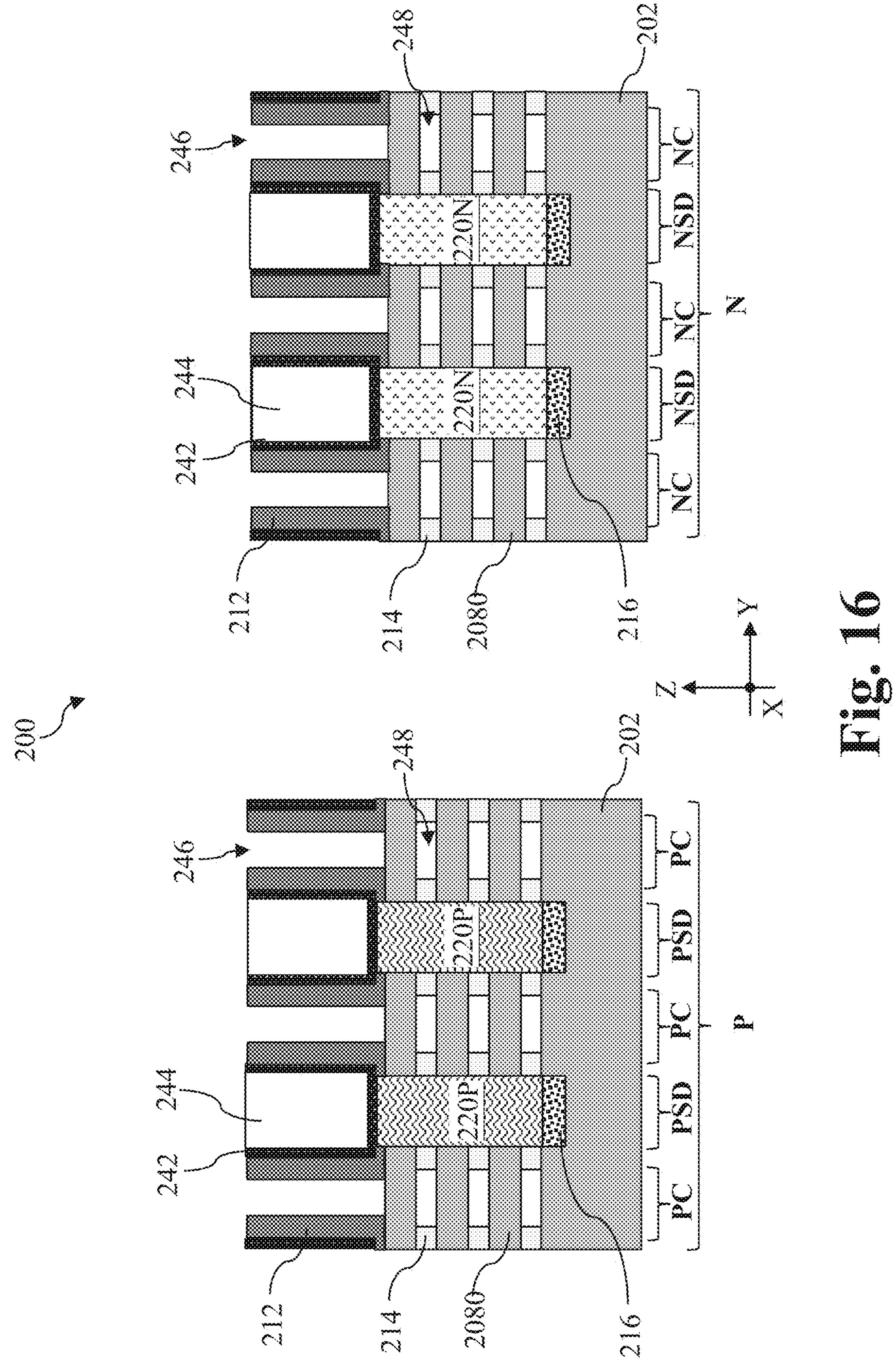

Referring to FIGS. 3 and 16, method 100 includes a block 120 where channel layers 208 over the buffer zones 15 and the device region 12 are released as channel members 2080. Referring to FIG. 16, after the removal of the dummy gate stack 230 to form the gate trench 246, the method 100 selectively removes the sacrificial layers 206 between the channel layers 208 in the n-type and p-type channel regions NC and PC. The selective removal of the sacrificial layers 206 releases the channel layers 208 in FIG. 15 to form channel members 2080 in FIG. 16. The selective removal of the sacrificial layers 206 also leave behind space 248 between channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Up until block 120, operations of method 100 are performed in discriminatorily between the buffer zones 15 and the device regions 12. That means, the structures formed as a result of operations at block 120 are generally the same across the buffer zones 15 and device regions 12. For example, n-type source/drain features 220N in device regions 12 may be similar to n-type epitaxial features 220N in the buffer zones 15 in terms of composition and dimensions, and p-type source/drain features 220P in device regions 12 may be similar to p-type epitaxial features 220P in the buffer zones 15 in terms of composition and dimensions. The same can be said with the channel members 2080. The channel members 2080 in the device regions 12 and the buffer zones 15 may be of the same composition or dimensions. After block 120, method 100 bifurcates and perform different operations to structures in the device regions 12 and those in the buffer zones 15. As will be described further below, block 122 forms a gate structure 250 to wrap around channel members 2080 in the device regions 12 and block 124 forms a dielectric gate structure 260 to cut through channel members 2080 in the buffer zones 15.

Figure 17:
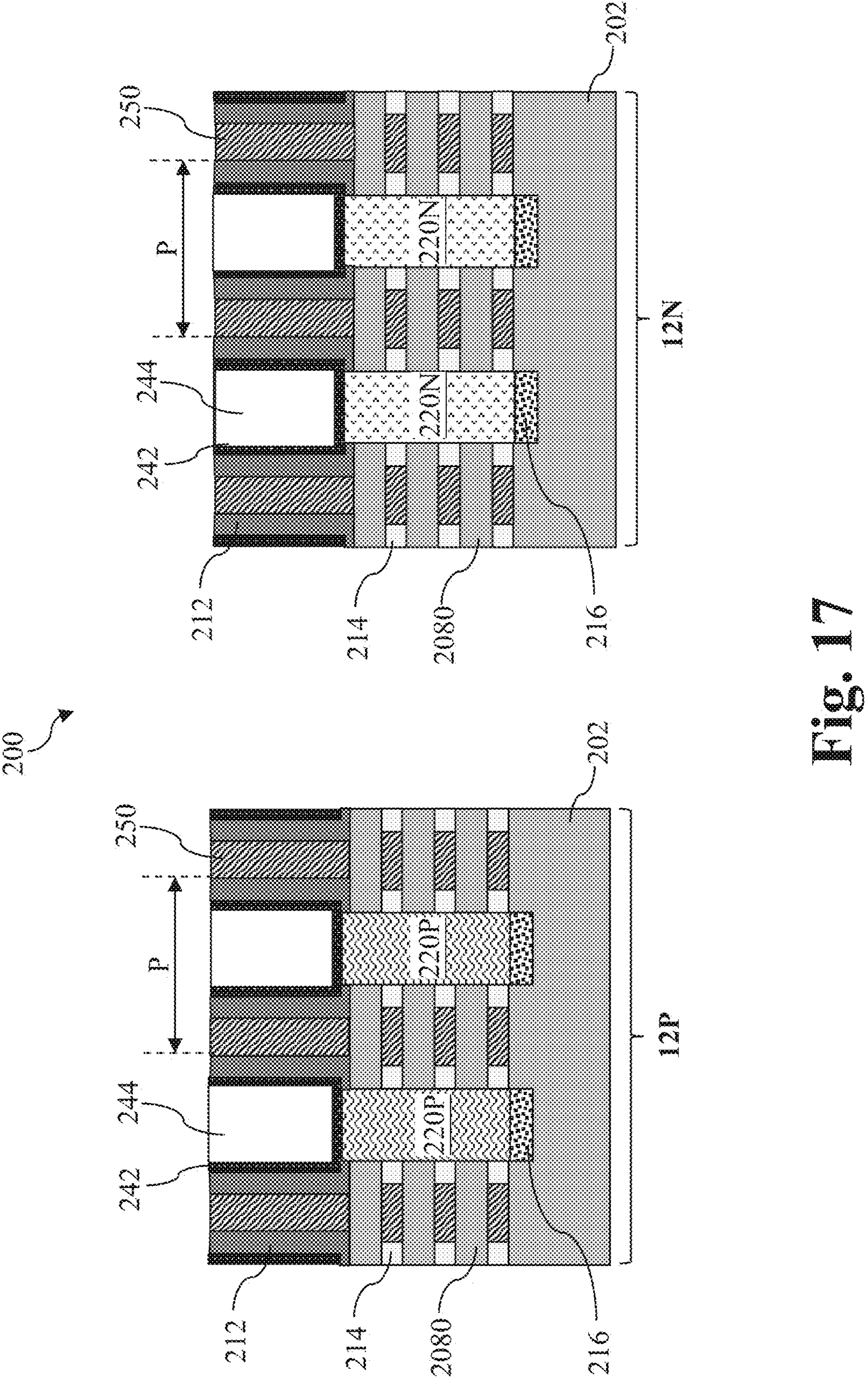

Referring to FIGS. 3 and 17, method 100 includes a block 122 where gate structures 250 are selectively formed over the device region 12. In order to achieve differentiated treatment of the device region 12, a mask layer may be deposited over the buffer zones 15. The mask layer may include a bottom antireflective coating (BARC) layer, a photoresist layer, or a combination thereof. The mask layer may be first blanketly deposited over the WIP structure 200 and then lithographically patterned to selectively cover the buffer zones 15. The gate structure 250 includes a gate dielectric layer and a gate electrode layer over the gate dielectric layer. In some embodiments, the gate dielectric layer includes an interfacial layer disposed on the channel members 2080 and a high-K gate dielectric layer over the interfacial layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structure 250. Because the gate structure 250 includes the high-k gate dielectric layer and various metal layers in the gate electrode layer, the gate structure 250 may be referred to a high-k metal gate or a high-k metal gate structure. After the formation of the gate structure 250, the mask layer covering the buffer zones 15 may be removed. As shown in FIG. 17, the gate structure 250 is formed in n-type device regions 12N and p-type device regions 12P in the device region 12. At conclusion of block 122, an n-type gate-all-around (GAA) transistor is formed in the n-type device region 12N and a p-type GAA transistor is formed in the p-type device region 12P in FIG. 17. In the depicted embodiments, the gate structures 250 in the p-type device regions 12P and the n-type device regions 12N have a gate pitch P.

Figure 18:
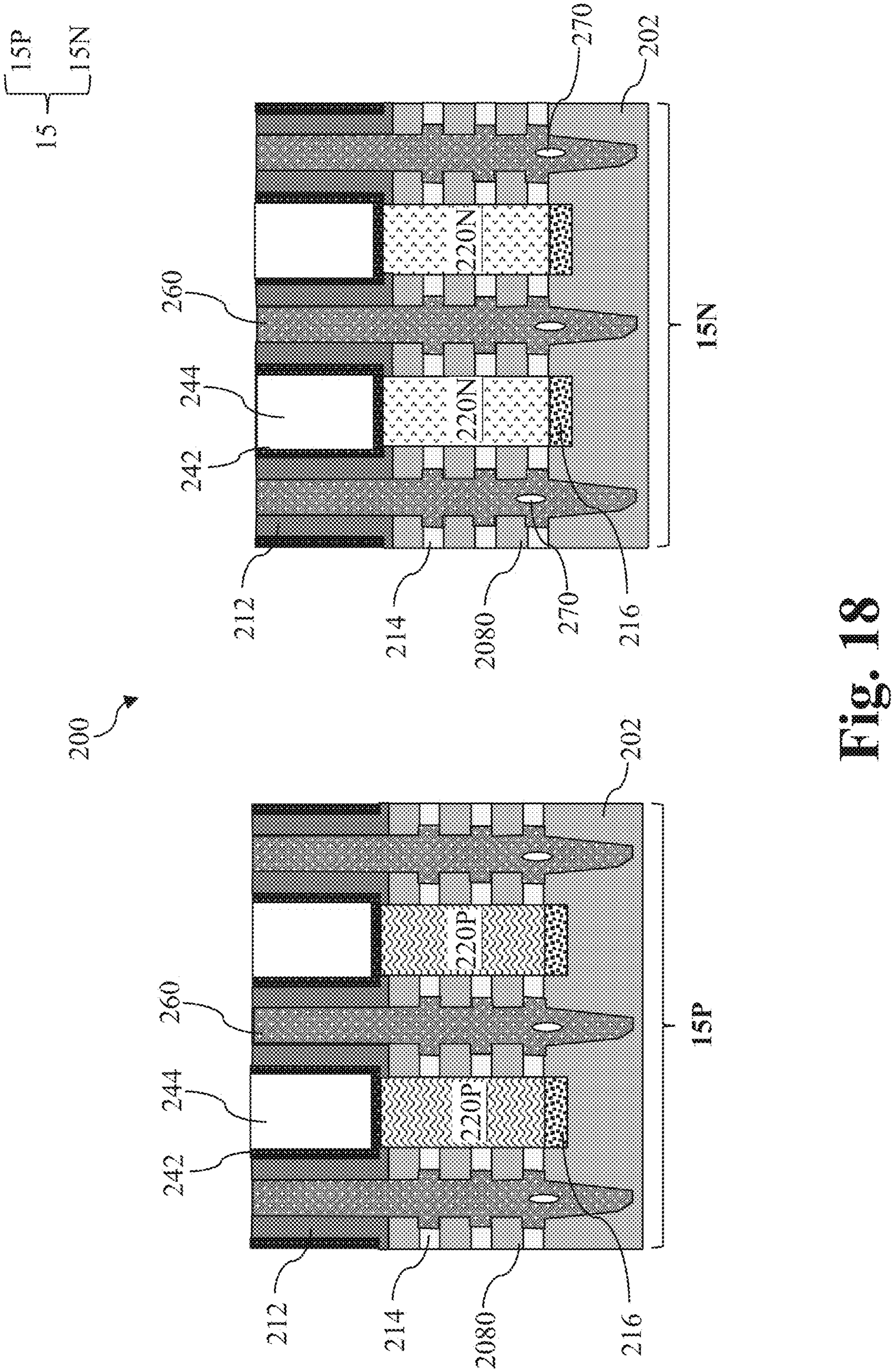

Referring to FIGS. 3 and 18, method 100 includes a block 124 where dielectric gate structures 260 are formed over the buffer zone 15. As will be described further below, the buffer zone 15 may include p-type buffer zones 15P and/or n-type buffer zones 15N. P-type source/drain features 220P may be found in p-type buffer zones 15P and n-type source/drain features 220N may be found in n-type buffer zones 15N. While forming gate structure 250 over the buffer zones 15 appears to be a cost effective option, it can lead to defects when form the TSV opening through the buffer zones 15. Experimental and simulation data indicate that when gate structures 250 are formed over the buffer zones 15, the high-k dielectric layer and the metal layers in the gate electrode layer in the gate structure 250 can slow the etch process down. Etching processes that are designed to remove these slow-to-etch features may cause over-etching and defects in surrounding structures. Etching processes that cannot satisfactorily remove these slow-to-etch features may leave conductive residues behind, which may lead to undesirable leaks or unsatisfactory formation of the TSV.

Additionally, etching of the gate structure 250 tends to create metal debris that can contaminate the process chamber and reduce production yield. For these reasons, block 124 separately forms dielectric gate structures 260 that are formed over the buffer zones 15. In some embodiments, the dielectric gate structures 260 may include silicon nitride, silicon oxynitride, silicon carbonitride, or silicon oxycarbonitride. In one embodiment, the dielectric gate structure 260 includes silicon nitride. According to the present disclosure, the dielectric gate structure 260 is free of a dielectric material with a dielectric constant greater than 7 (which is about the dielectric constant of silicon nitride). Additionally, the dielectric gate structure 260 is not electrically conductive and is free of any metal.

Block 124 includes an etch process to form an extended opening through the channel regions in the p-type buffer zone 15P and the n-type buffer zone 15N and then a dielectric material is deposited over the extended opening to form the dielectric gate structure 260. In the depicted embodiments, the formation of the extended opening includes use of an anisotropic etch process and the extended opening extends through all of the channel members 2080. In some embodiments, because the dielectric gate structures 260 are formed alongside with isolation structures to divide active regions, such as continuous poly on diffusion edge (CPODE) features, the extended openings extend into the substrate 202. Thereafter, the dielectric gate structure 260 may be deposited using CVD or ALD. The dielectric gate structure 260 wraps over edge sidewalls of the severed channel members 2080. In some embodiments, the dielectric gate structure 260 may not completely fill the extended opening and may leave behind a void 270. As shown in FIG. 18, the dielectric gate structure 260 is formed in n-type buffer zones 15N and p-type buffer zones 15N in the buffer zone 15. The transistor-like structures having the dielectric gate structure 260 are not functional and may be referred to as dummy transistors or dummy transistor structures.

Referring to FIG. 3, method 100 includes a block 126 where further processes are performed. For example, block 126 may include formation of a frontside interconnect structure 30 over the WIP structure 200 and formation of a TSV 16 through the frontside interconnect structure 30 and the substrate 202.

N-type source/drain features 220N (or n-type epitaxial features 220N) and p-type source/drain features 220P (or p-type epitaxial features 220P) exert different stress on surrounding structures. For example, p-type source/drain features 220P (or p-type epitaxial features 220P) may exert compressive stress on the channel members 2080. According to the present disclosure, because the device region 12 includes both N-type source/drain features 220N and p-type source/drain features 220P, the buffer zone 13 should also include n-type epitaxial features 220N and p-type epitaxial features 220P to provide a similar environment. Additionally, it is a goal of the present disclosure to provide a relatively stress-free buffer zone 15 for formation of the TSV 16. Based on these premises, the present disclosure provides four (4) example arrangements shown in FIGS. 19-22.

Figure 19:
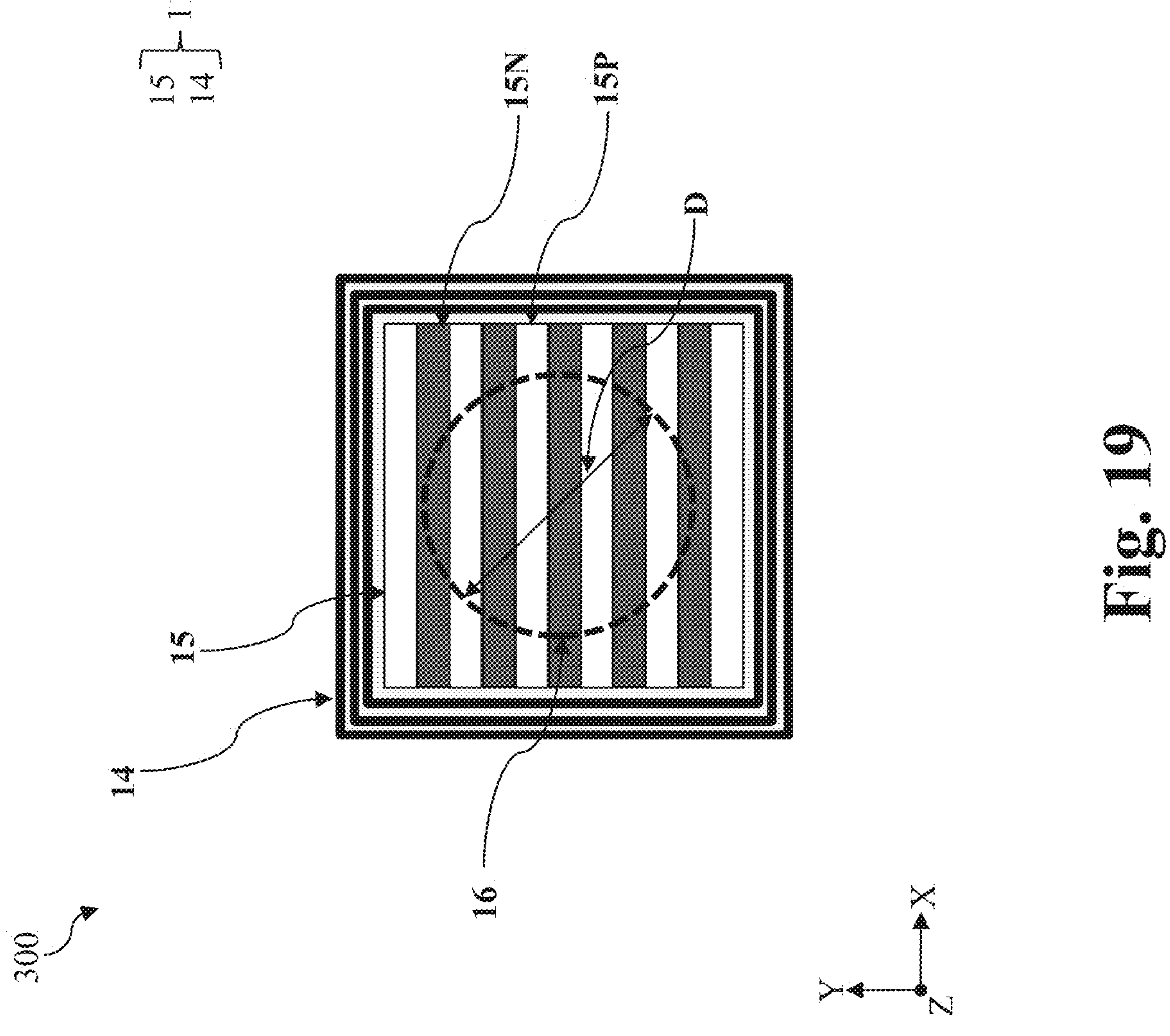
FIGS. 19-22 illustrates example embodiments of TSV cells, according to various aspects of the present disclosure.

FIG. 19 illustrates a first example arrangement 300. In the first example arrangement 300, the buffer zone 15 includes stripe-like n-type buffer zone 15N and stripe-like p-type buffer zone 15P. The stripe-like n-type buffer zone 15N includes the transistor-like structure shown in FIG. 18. The stripe-like p-type buffer zone 15P includes the transistor-like structure shown in FIG. 18. The stripe-like n-type buffer zone 15N and the stripe-like p-type buffer zone 15P extend in parallel along a direction (X direction in FIG. 19) parallel to an edge of the TSV cell 11. In some implementations, the guard ring 14 and the buffer zone 15 may each have a rectangular shape when viewed along the Z direction. In the depicted embodiments, the guard ring 14 and the buffer zone 15 are square in shape from a top view and are concentric with respect to a center of a circular cross section of the TSV 16. The circular cross section of the TSV 16 has a diameter D. In some instances, a ratio of the diameter D to the gate pitch P may be between about 10 and about 400.

Figure 20:
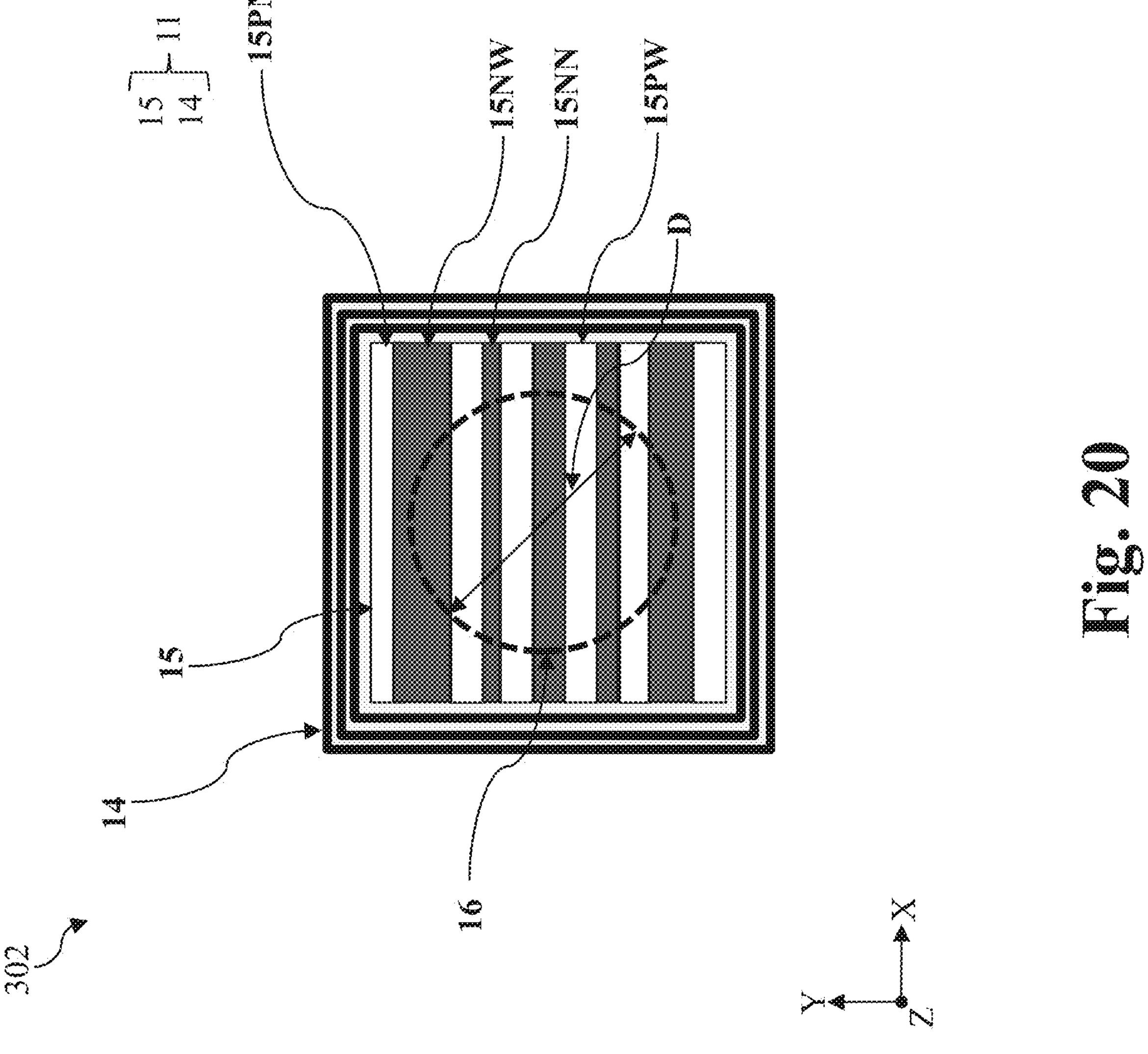

FIG. 20 illustrates a second example arrangement 302. The second example arrangement 302 is similar to the first example arrangement 300 except that the stripe-like buffer zones in the buffer zone 15 may come in different width. In FIG. 20, the buffer zone 15 includes a wide n-type buffer zone 15WN, a narrow n-type buffer zone 15NN, a wide p-type buffer zone 15PW, and a narrow p-type buffer zone 15PN. The wide and narrow stripe-like regions may be arranged to maximize stress cancelation for the TSV 16. In some implementations, the guard ring 14 and the buffer zone 15 may each have a rectangular shape when viewed along the Z direction. In the depicted embodiments, the guard ring 14 and the buffer zone 15 are square in shape from a top view and are concentric with respect to a center of a circular cross section of the TSV 16. The circular cross section of the TSV 16 has a diameter D. In some instances, a ratio of the diameter D to the gate pitch P may be between about 10 and about 400.

Figure 21:
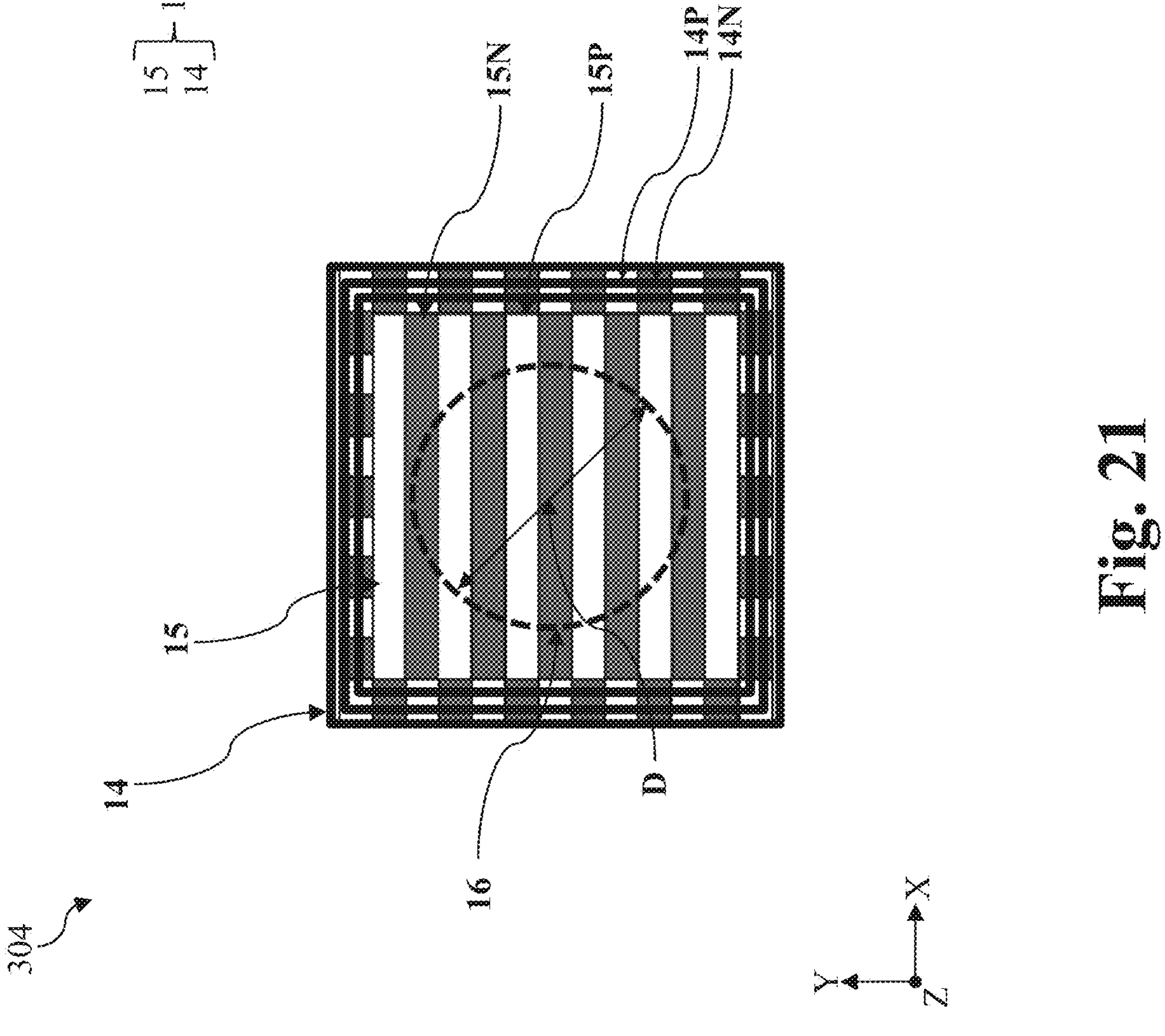

FIG. 21 illustrates a third example arrangement 304. The third example arrangement 304 is similar to the first example arrangement 300 except that the guard ring 14 includes n-type regions 14N and p-type regions 14P arranged alternatingly around the buffer zone 15. In example process to form a continuous epitaxial structure in the guard ring 14, n-type epitaxial features and p-type epitaxial features are sequentially and separately formed in the n-type regions 14N and p-type regions 14P using masking layers and photolithography techniques. The separately formed n-type epitaxial features and p-type epitaxial features are physically connected to go around the guard ring 14. In some embodiments, the n-type regions 14N and p-type regions 14P that step alternatively in the guard ring 14 are rectangular in shape and have the same dimensions. In some implementations, the guard ring 14 and the buffer zone 15 may each have a rectangular shape when viewed along the Z direction. In the depicted embodiments, the guard ring 14 and the buffer zone 15 are square in shape from a top view and are concentric with respect to a center of a circular cross section of the TSV 16. The circular cross section of the TSV 16 has a diameter D. In some instances, a ratio of the diameter D to the gate pitch P may be between about 10 and about 400.

Figure 22:
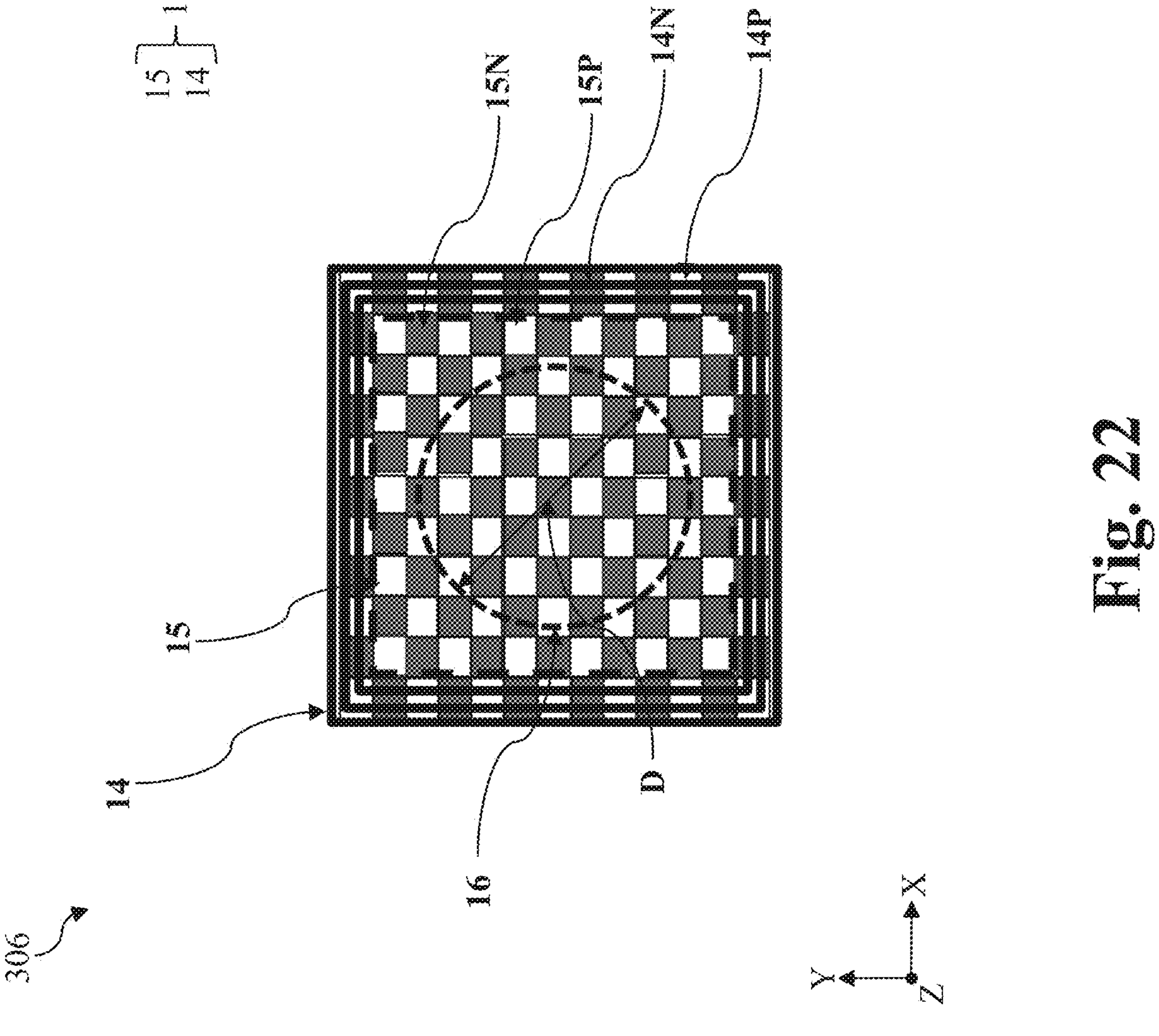

FIG. 22 illustrates a fourth example arrangement 306. The fourth example arrangement 306 is similar to the third example arrangement 304 except that the buffer zone 15 includes block-like n-type buffer zones 15N and block-like p-type buffer zones 15P arranged in a checkerboard fashion. That is, each of the block-like n-type buffer zones 15N borders four (4) block-like p-type buffer zones 15P along its four straight edges, and each of the block-like p-type buffer zones 15P borders four (4) block-like n-type buffer zones 15N along its four straight edges. In some implementations, the guard ring 14 and the buffer zone 15 may each have a rectangular shape when viewed along the Z direction. In the depicted embodiments, the guard ring 14 and the buffer zone 15 are square in shape from a top view and are concentric with respect to a center of a rectangular cross section of the TSV 16. The circular cross section of the TSV 16 has a diameter D. In some instances, a ratio of the diameter D to the gate pitch P may be between about 10 and about 400.

Figure 23:
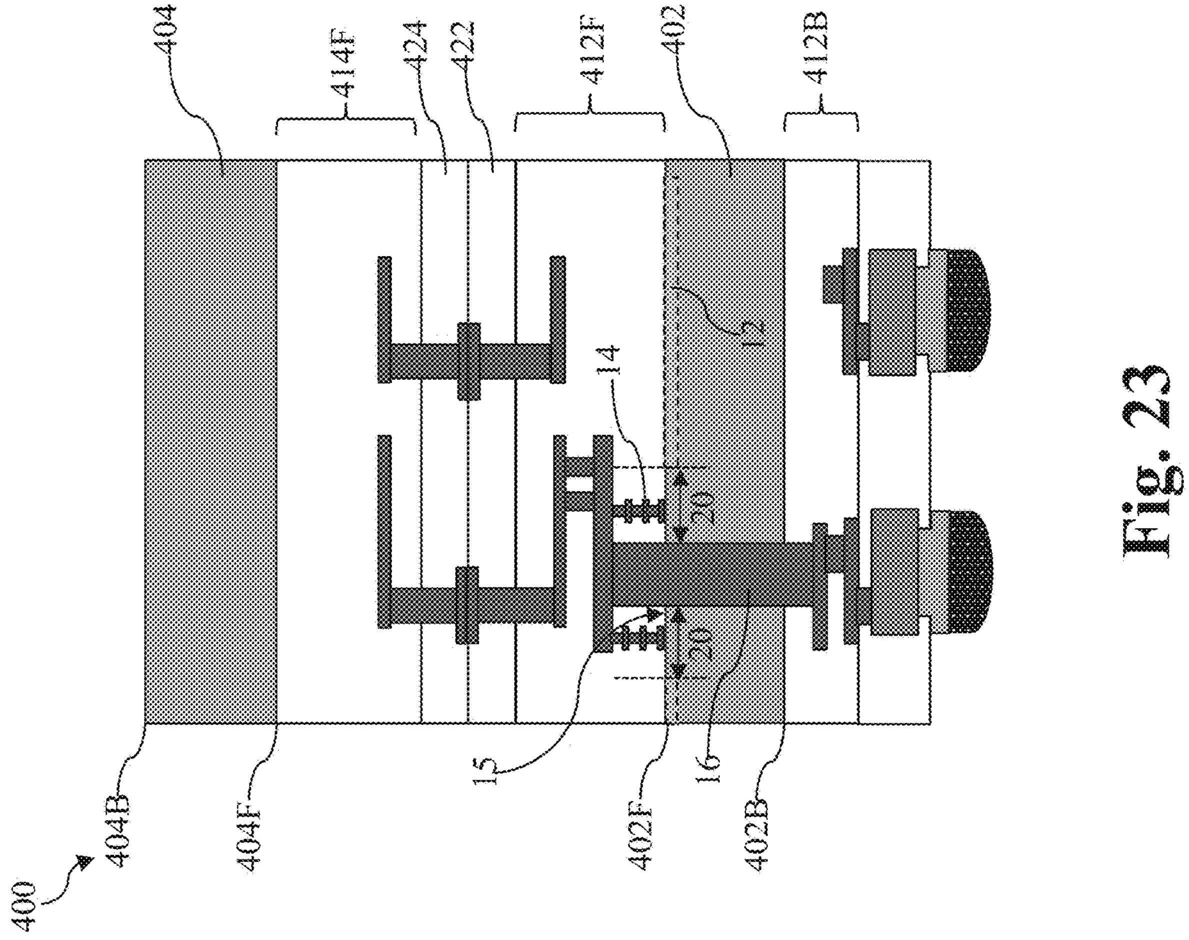
FIG. 23 illustrates a first IC package having a TSV cell according to various aspects of the present disclosure.
Figure 24:
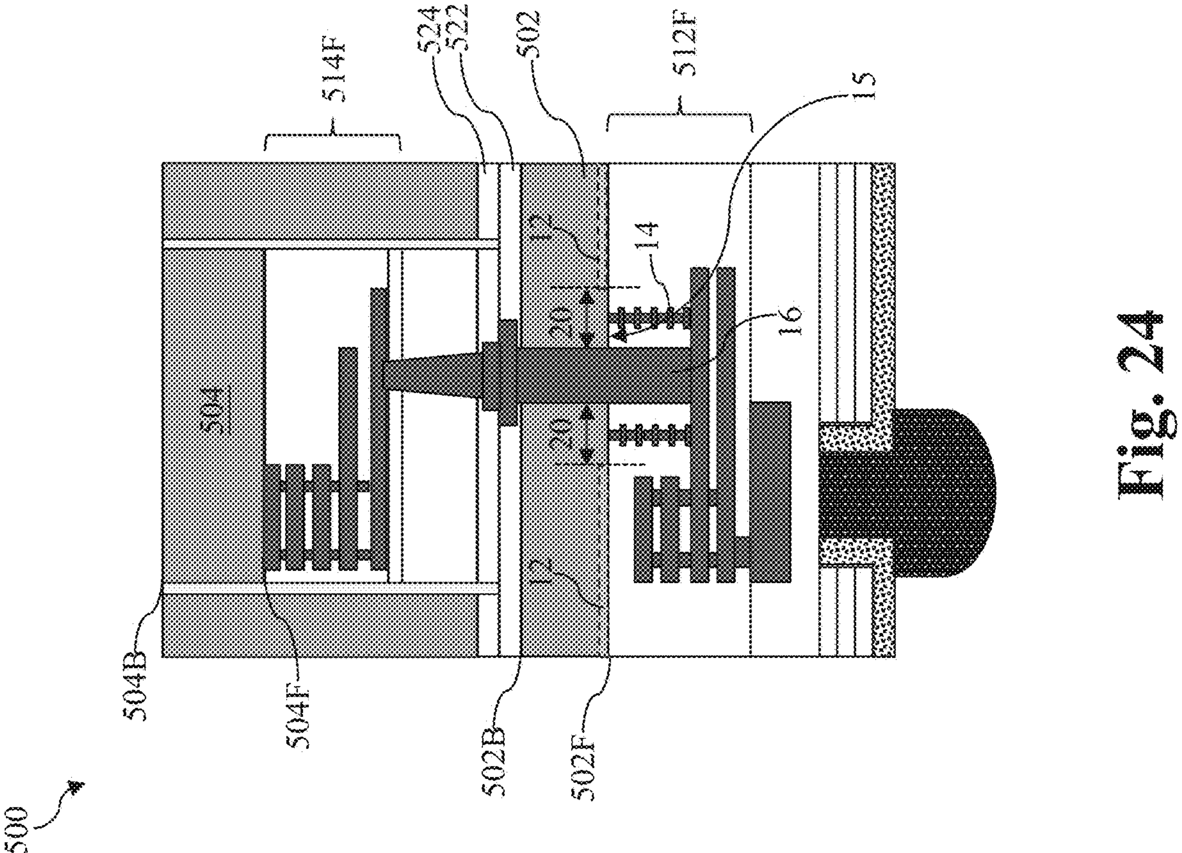
FIG. 24 illustrates a second IC package having a TSV cell according to various aspects of the present disclosure.

FIGS. 23 and 24 schematically illustrate how the TSV cell region 11 of the present disclosure appears in a face-to-face (F2F) stacking structure 400 and a face-to-back (F2B) stacking structure 500.

Reference is first made to FIG. 23. The F2F stacking structure 400 includes a first substrate 402 and a second substrate 404. Routing for the first substrate 402 is provided through a first frontside interconnect structure 412F over a first front surface 402F and a first backside interconnect structure 412B over a first back surface 402B. Routing for the second substrate 404 is provided through a second frontside interconnect structure 414F over a second front surface 404F, which is opposed to a second back surface 404B. The first frontside interconnect structure 412F is bonded to the second frontside interconnect structure 414F by way of a first bonding layer 422 and a second bonding layer 424. Each of the first bonding layer 422 and the second bonding layer 424 includes metal pads embedded in a dielectric layer. The metal pads in the first bonding layer 422 are aligned with the metal pads in the second bonding layer 424 when they are directly bonded as shown in FIG. 23. The device region 12 on the first substrate 402 is outside the KOZ 20 of the TSV 16. The TSV 16 in FIG. 23 extends completely through the first substrate 402 and extends partially into the first frontside interconnect structure 412F and the first backside interconnect structure 412B. The transistor-like structures as shown in FIGS. 19-22 may be found in the buffer zone 15 indicated by the arrow in FIG. 23.

Reference is then made to FIG. 24. The F2B stacking structure 500 includes a lower substrate 502 and an upper substrate 504. Routing for the lower substrate 502 is provided through a lower frontside interconnect structure 512F over a lower front surface 502F, which is opposed to a lower back surface 502B. Routing for the upper substrate 504 is provided through a upper frontside interconnect structure 514F over an upper front surface 504F, which is opposed to an upper back surface 504B. The lower frontside interconnect structure 512F is bonded to the upper frontside interconnect structure 514F by way of a lower bonding layer 522 and an upper bonding layer 524. Each of the lower bonding layer 522 and the upper bonding layer 524 includes metal pads embedded in a dielectric layer. The metal pads in the lower bonding layer 522 are aligned with the metal pads in the upper bonding layer 524 when they are directly bonded as shown in FIG. 24. The device region 12 on the lower substrate 502 is outside the KOZ 20 of the TSV 16. The TSV 16 in FIG. 24 extends completely through the lower substrate 502 and extends partially into the lower frontside interconnect structure 512F. The transistor-like structures as shown in FIGS. 19-22 may be found in the buffer zone 15 indicated by the arrow in FIG. 24.

In one exemplary aspect, the present disclosure is directed to a semiconductor structure. The semiconductor structure includes a substrate, a through substrate via (TSV) cell disposed over the substrate, a TSV extending through the TSV cell and the substrate. The TSV cell includes a guard ring structure extending continuously around a perimeter of the TSV cell and a buffer zone surrounded by the guard ring structure. The buffer zone includes a plurality of first dummy transistors and a plurality of second dummy transistors. Each of the plurality of first dummy transistors includes two first type epitaxial features, a first plurality of nanostructures extending between the two first type epitaxial features, and a first isolation gate structure extending through the first plurality of nanostructures. Each of the plurality of second dummy transistors includes two second type epitaxial features, a second plurality of nanostructures extending between the two first type epitaxial features, and a second isolation gate structure extending through the second plurality of nanostructures.

In some embodiments, the two first type epitaxial features include silicon (Si) and an n-type dopant. The two second type epitaxial features include silicon germanium (SiGe) and a p-type dopant. The substrate includes silicon (Si) and the TSV includes copper (Cu), aluminum (Al), cobalt (Co), copper alloy, tantalum (Ta), titanium (Ti), or tungsten (W). In some implementations, the first isolation gate structure and the second isolation gate structure include silicon nitride. In some instances, a portion of the first isolation gate structure extends into the substrate and a portion of the second isolation gate structure extends into the substrate. In some embodiments, the semiconductor structure further includes a first void disposed among the first plurality of nanostructures and a second void disposed among the second plurality of nanostructures. In some instances, from a top view, the TSV cell includes a square shape. In some embodiments, from a top view, the TSV includes a circular shape.

In another exemplary aspect, the present disclosure is directed to a semiconductor structure. The semiconductor structure includes a substrate that includes a first region and a second region, a plurality of n-type transistors and plurality of p-type transistors in the first region, and a plurality of first-type dummy transistor and a plurality of second-type dummy transistor in the second region. Each of the plurality of n-type transistors includes two n-type source/drain features, a first plurality of nanostructures extending between the two n-type source/drain features, and a first gate structure wrapping around each of the first plurality of nanostructures. Each of the plurality of p-type transistors includes two p-type source/drain features, a second plurality of nanostructures extending between the two p-type source/drain features, and a second gate structure wrapping around each of the second plurality of nanostructures. Each of the plurality of first-type dummy transistors includes two n-type epitaxial features, a third plurality of nanostructures extending between the two n-type epitaxial features, and a first dielectric gate structure extending through the third plurality of nanostructures. Each of the plurality of second-type dummy transistors includes two p-type epitaxial features, a fourth plurality of nanostructures extending between the two p-type epitaxial features, and a second dielectric gate structure extending through the fourth plurality of nanostructures.

In some embodiments, the second region further includes a guard ring structure extending continuously around a perimeter of the second region. In some instances, the semiconductor structure further includes a through via extending through the second region and the substrate. In some embodiments, the first gate structure and the second gate structure include a metal and the first dielectric gate structure and the second dielectric gate structure are free of any metal. In some embodiments, the first dielectric gate structure and the second dielectric gate structure includes silicon nitride. In some embodiments, dimensions of the first plurality of nanostructures are substantial the same as dimensions of the third plurality of nanostructures. In some implementations, the two n-type epitaxial features include silicon (Si) and an n-type dopant and the two p-type epitaxial features include silicon germanium (SiGe) and a p-type dopant. In some embodiments, a portion of the first dielectric gate structure is disposed among the third plurality of nanostructures and a portion of the second dielectric gate structure is disposed among the fourth plurality of nanostructures. In some embodiments, the semiconductor structure further includes a first void disposed among the third plurality of nanostructures, and a second void disposed among the fourth plurality of nanostructures.

In yet another exemplary aspect, the present disclosure is directed to a method. The method includes receiving an intermediate structure that includes a substrate that includes a first region and a second region, and a stack over the first region and the second region, the stack including a plurality of channel layers interleaved by a plurality of sacrificial layers, patterning the stack and a portion of the substrate to form a first fin-shaped structure over the first region and a second fin-shaped structure over the second region, forming a first dummy gate stack over a channel region of the first fin-shaped structure and a second dummy gate stack over a channel region of the second fin-shaped structure, etching source/drain regions of the first fin-shaped structure and the second fin-shaped structure to form source/drain recesses, forming epitaxial features in the source/drain recesses, selectively removing the plurality of sacrificial layers in the channel regions of the first fin-shaped structure and the second fin-shaped structure to form first channel members over the first region and second channel members over the second region, selectively forming a gate structure to wrap around each of the first channel members, and selectively forming a dielectric gate structure to wrap over each of the second channel member.

In some embodiments, wherein the dielectric gate structure is free of any metal. In some embodiments, the dielectric gate structure consists essentially of silicon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a through substrate via (TSV) cell disposed over the substrate; and
a TSV extending through the TSV cell and the substrate,
wherein the TSV cell comprises:
a guard ring structure extending continuously around a perimeter of the TSV cell, and
a buffer zone surrounded by the guard ring structure,
wherein the buffer zone comprises:
a plurality of first dummy transistors, and
a plurality of second dummy transistors,
wherein each of the plurality of first dummy transistors comprises:
two first type epitaxial features,
a first plurality of nanostructures extending between the two first type epitaxial features, and
a first isolation gate structure extending through the first plurality of nanostructures,
wherein each of the plurality of second dummy transistors comprises:
two second type epitaxial features,
a second plurality of nanostructures extending between the two first type epitaxial features, and
a second isolation gate structure extending through the second plurality of nanostructures.

2. The semiconductor structure of claim 1,
wherein the two first type epitaxial features comprise silicon (Si) and an n-type dopant,
wherein the two second type epitaxial features comprise silicon germanium (SiGe) and a p-type dopant.

3. The semiconductor structure of claim 1,
wherein the substrate comprises silicon (Si),
wherein the TSV comprises copper (Cu), aluminum (Al), cobalt (Co), copper alloy, tantalum (Ta), titanium (Ti), or tungsten (W).

4. The semiconductor structure of claim 1, wherein the first isolation gate structure and the second isolation gate structure comprise silicon nitride.

5. The semiconductor structure of claim 1, wherein a portion of the first isolation gate structure extends into the substrate,
wherein a portion of the second isolation gate structure extends into the substrate.

6. The semiconductor structure of claim 1, further comprises:
a first void disposed among the first plurality of nanostructures; and
a second void disposed among the second plurality of nanostructures.

7. The semiconductor structure of claim 1, wherein, from a top view, the TSV cell comprises a square shape.

8. The semiconductor structure of claim 1, wherein, from a top view, the TSV comprises a circular shape.

9. A semiconductor structure, comprising:
a substrate comprising a first region and a second region;
a plurality of n-type transistors and plurality of p-type transistors in the first region; and
a plurality of first-type dummy transistor and a plurality of second-type dummy transistor in the second region,
wherein each of the plurality of n-type transistors comprises:
two n-type source/drain features,
a first plurality of nanostructures extending between the two n-type source/drain features, and
a first gate structure wrapping around each of the first plurality of nanostructures,
wherein each of the plurality of p-type transistors comprises:

two p-type source/drain features, a second plurality of nanostructures extending between the two p-type source/drain features, and a second gate structure wrapping around each of the second plurality of nanostructures, wherein each of the plurality of first-type dummy transistors comprises:

two n-type epitaxial features, a third plurality of nanostructures extending between the two n-type epitaxial features, and a first dielectric gate structure extending through the third plurality of nanostructures, wherein each of the plurality of second-type dummy transistors comprises:

two p-type epitaxial features, a fourth plurality of nanostructures extending between the two p-type epitaxial features, and a second dielectric gate structure extending through the fourth plurality of nanostructures.

10. The semiconductor structure of claim 9, wherein the second region further comprises a guard ring structure extending continuously around a perimeter of the second region.

11. The semiconductor structure of claim 10, further comprising:

a through via extending through the second region and the substrate.

12. The semiconductor structure of claim 9, wherein the first gate structure and the second gate structure comprise a metal, wherein the first dielectric gate structure and the second dielectric gate structure are free of any metal.

13. The semiconductor structure of claim 9, wherein the first dielectric gate structure and the second dielectric gate structure comprise silicon nitride.

14. The semiconductor structure of claim 9, wherein dimensions of the first plurality of nanostructures are substantial the same as dimensions of the third plurality of nanostructures.

15. The semiconductor structure of claim 9, wherein the two n-type epitaxial features comprise silicon (Si) and an n-type dopant, wherein the two p-type epitaxial features comprise silicon germanium (SiGe) and a p-type dopant.

16. The semiconductor structure of claim 9, wherein a portion of the first dielectric gate structure is disposed among the third plurality of nanostructures, wherein a portion of the second dielectric gate structure is disposed among the fourth plurality of nanostructures.

17. The semiconductor structure of claim 16, further comprises:

a first void disposed among the third plurality of nanostructures; and a second void disposed among the fourth plurality of nanostructures.

18. A method, comprising:

receiving an intermediate structure comprising:

a substrate comprising a first region and a second region, and a stack over the first region and the second region, the stack comprising a plurality of channel layers interleaved by a plurality of sacrificial layers;

patterning the stack and a portion of the substrate to form a first fin-shaped structure over the first region and a second fin-shaped structure over the second region;

forming a first dummy gate stack over a channel region of the first fin-shaped structure and a second dummy gate stack over a channel region of the second fin-shaped structure;

etching source/drain regions of the first fin-shaped structure and the second fin-shaped structure to form source/drain recesses;

forming epitaxial features in the source/drain recesses;

selectively removing the plurality of sacrificial layers in the channel regions of the first fin-shaped structure and the second fin-shaped structure to form first channel members over the first region and second channel members over the second region;

selectively forming a gate structure to wrap around each of the first channel members; and selectively forming a dielectric gate structure to wrap over each of the second channel members.

19. The method of claim 18, wherein the dielectric gate structure is free of any metal.

20. The method of claim 18, wherein the dielectric gate structure consists essentially of silicon nitride.

* * * * *